(12) United States Patent
Hashimoto et al.

(10) Patent No.: US 8,199,554 B2
(45) Date of Patent: Jun. 12, 2012

(54) FERRO-ELECTRIC RANDOM ACCESS MEMORY APPARATUS

(75) Inventors: Daisuke Hashimoto, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/876,984

(22) Filed: Sep. 7, 2010

(65) Prior Publication Data
US 2011/0058403 A1   Mar. 10, 2011

(30) Foreign Application Priority Data

Sep. 7, 2009  (JP) ................. 2009-205846

(51) Int. Cl.
*G11C 11/22* (2006.01)
(52) U.S. Cl. ............. 365/145; 365/117; 365/49.13; 365/207; 365/189.11
(58) Field of Classification Search .......... 365/145, 365/117, 49.13, 196, 207, 189.11, 210.1
See application file for complete search history.

(56) References Cited

U.S. PATENT DOCUMENTS

| | | | |
|---|---|---|---|
| 5,903,492 A | 5/1999 | Takashima | |
| 6,288,950 B1 * | 9/2001 | Koike | ............... 365/189.09 |
| 6,487,104 B2 | 11/2002 | Takashima | |
| 2005/0063214 A1 | 3/2005 | Takashima | |
| 2009/0103349 A1 | 4/2009 | Hoya | |
| 2009/0231902 A1 | 9/2009 | Takashima | |

FOREIGN PATENT DOCUMENTS

| | | |
|---|---|---|
| JP | 2001-319472 A | 11/2001 |
| JP | 2009-099235 A | 5/2009 |

OTHER PUBLICATIONS

Hoya et al., "A 64Mb chain FeRAM with Quad-BL Architecture and 200Mb/s Burst Mode," International Solid-State Circuits Conference 2006/Session 7/Non-Volatile Memory/7.2, Feb. 6, 2006, pp. 459-466.
Takashima et al., "A 76-mm$^2$ 8-Mb Chain Ferroelectric Memory," IEEE Journal of Solid-State Circuits, vol. 36, No. 11, Nov. 2001, pp. 1713-1720.

* cited by examiner

*Primary Examiner* — Thong Q Le
(74) *Attorney, Agent, or Firm* — Knobbe, Martens, Olson & Bear LLP

(57) ABSTRACT

A ferro-electric random access memory apparatus has a memory cell array in which a plurality of memory cells each formed of a ferro-electric capacitor and a transistor are arranged, word lines are disposed to select a memory cell, plate lines are disposed to apply a voltage to a first end of the ferro-electric capacitor in a memory cell, and bit lines are disposed to read cell data from a second end of the ferro-electric capacitor in the memory cell. The ferro-electric random access memory apparatus has a sense amplifier which senses and amplifies a signal read from the ferro-electric capacitor onto the bit line. The ferro-electric random access memory apparatus has a bit line potential control circuit which exercises control to pull down a voltage on an adjacent bit line adjacent to the selected bit line onto which the signal is read, before operation of the sense amplifier at time of data readout.

9 Claims, 11 Drawing Sheets

FERRO-ELECTRIC RANDOM ACCESS MEMORY APPARATUS

CROSS-REFERENCE TO RELATED APPLICATION

This application is based upon and claims the benefit of priority from the prior Japanese Patent Application No. 2009-205846, filed on Sep. 7, 2009, the entire contents of which are incorporated herein by reference.

BACKGROUND

1. Field of Invention

Embodiments described herein relate generally to a ferro-electric random access memory (FeRAM) apparatus having a plurality of bit lines arranged in parallel.

2. Background Art

In recent years, a ferro-electric random access memory (FeRAM) apparatus using a ferro-electric capacitor has attracted attention as one of non-volatile semiconductor memories.

At the time of write operation of a conventional ferro-electric random access memory, a power supply potential Vaa having the same amplitude as amplitude on a bit line can be applied to the ferro-electric capacitor. At the time of read operation of the ferro-electric random access memory, however, only voltage which is lower than the power supply potential Vaa is applied to the ferro-electric capacitor.

At the time of low voltage operation of the ferro-electric random access memory, therefore, polarization of the ferro-electric capacitor is not inverted sufficiently, resulting in degradation of the readout margin.

Measures taken by some conventional ferro-electric random access memories to cope with such degradation of the readout margin are as follows. For a coupling capacitor precharged at its first end to the power supply potential Vaa and connected at its second end to a bit line onto which a signal is read, the power supply potential Vaa is dropped to a ground potential Vss. As a result, a higher voltage is applied to the ferro-electric capacitor and more charges generated by polarization inversion are read onto the bit line (see, for example, JP-A-2001-319472 (KOKAI) and JP-A-2009-99235 (KOKAI)).

In the conventional ferro-electric random access memory, it becomes possible to secure the readout margin at the time of low voltage operation in this way. Hereafter, this scheme is referred to as "old overdrive scheme."

On the other hand, in the old overdrive scheme, a coupling capacitor must be newly added to the customary ferro-electric random access memory. As a result, there are two following problems.

(1) The area of the circuit is increased by addition of the coupling capacitor.

(2) Capacitance Co of the coupling capacitor is added to bit line capacitance Cb. As a result, effective bit line capacitance Cb' becomes Cb'=Cb+Co. This substantial increase of the bit line capacitance Cb' brings about lowering of the cell signal quantity margin. Therefore, effects brought about by the old overdrive scheme are lowered.

DETAILED DESCRIPTION

A ferro-electric random access memory apparatus has a memory cell array in which a plurality of memory cells each formed of a ferro-electric capacitor and a transistor are arranged, word lines are disposed to select a memory cell, plate lines are disposed to apply a voltage to a first end of the ferro-electric capacitor in a memory cell, and bit lines are disposed to read cell data from a second end of the ferro-electric capacitor in the memory cell. The ferro-electric random access memory apparatus has a sense amplifier which senses and amplifies a signal read from the ferro-electric capacitor onto the bit line. The ferro-electric random access memory apparatus has a bit line potential control circuit which exercises control to pull down a voltage on an adjacent bit line adjacent to the selected bit line onto which the signal is read, before operation of the sense amplifier at time of data readout.

Comparative Example

Characteristics of the conventional ferro-electric random access memory apparatus at the time of readout operation will now be studied as a comparative example.

Figure 1:
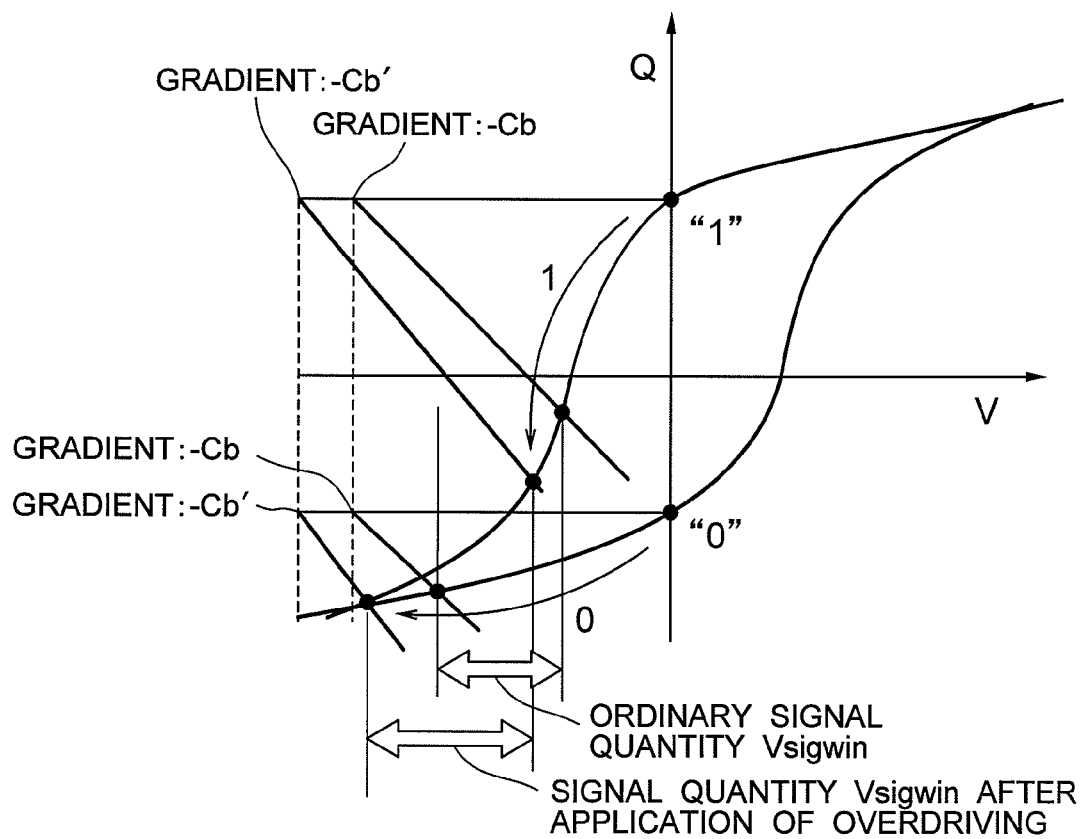
FIG. 1 is a diagram showing an example of hysteresis characteristics of a ferro-electric capacitor in a ferro-electric random access memory apparatus of a comparative example.
Figure 2:
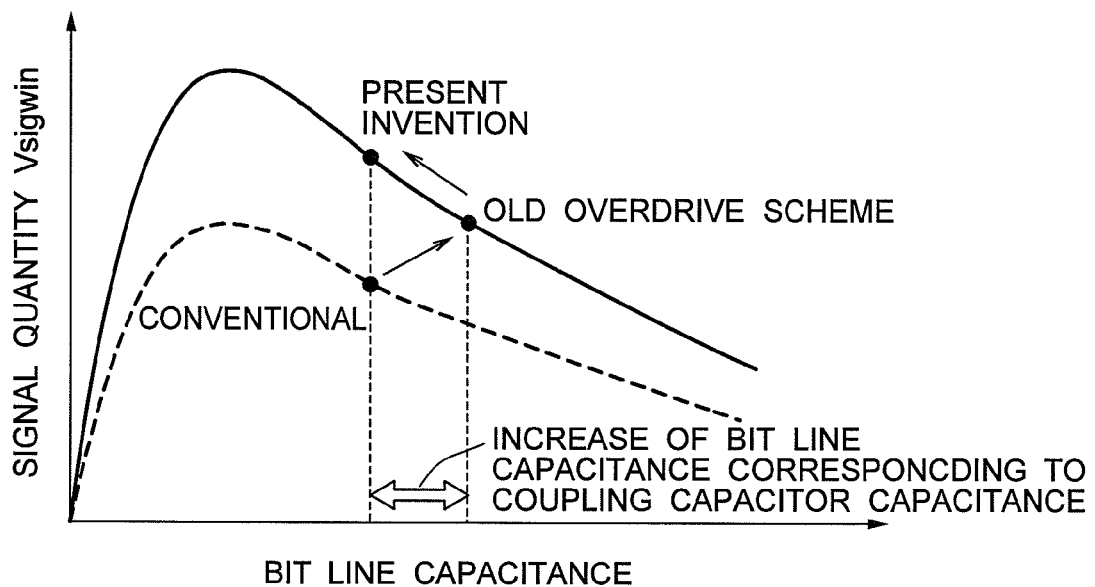
FIG. 2 is a diagram showing relations between a cell signal quantity and bit line capacitance in the ferro-electric random access memory apparatus.

FIG. 1 is a diagram showing an example of hysteresis characteristics of a ferro-electric capacitor in a ferro-electric random access memory apparatus of a comparative example. FIG. 2 is a diagram showing relations between a cell signal quantity and bit line capacitance in the ferro-electric random access memory apparatus.

In the old overdrive scheme already described, a difference (i.e., signal quantity Vsigwin) between bit line potentials at operation points respectively of data "0" and data "1" is increased by increasing the voltage applied to the ferro-electric capacitor.

According to definition of the operation point, operation points are points (Xop0, Yop0) and (Xop1, Yop1) of intersection of a hysteresis curve and a straight line which passes through a point (X=−Vaa−(Co/2Cb)*Vaa, Y=residual polarization of "0" or "1") and which has gradient of −Cb'=−(Cb−Co).

Bit line potentials Vsig0 and Vsig1 on these operation points are found respectively as Vsig0=Vaa−Xop0 and Vsig1=Vaa−Xop1.

Therefore, the signal quantity Vsigwin becomes Vsigwin=Vsig1−Vsig0.

In the old overdrive scheme, the gain of the signal quantity Vsigwin is increased by increasing the voltage applied to the ferro-electric capacitor in this way.

In the old overdrive scheme already described, the effective bit line capacitance Cb'=Cb+Co increases by the capacitance Co of the coupling capacitor. On the other hand, the increase of the effective bit line capacitance Cb' lowers the absolute values Vsig0 and Vsig1 of the bit line potentials, resulting in lowering of the signal quantity Vsigwin. In other words, in the old overdrive scheme, there is trade-off between the signal quantity increase effect obtained by increasing the voltage applied to the ferro-electric capacitor in the overdrive and the signal quantity lowering effect caused by the bit line capacitance increase which is brought about by the overdrive capacitor. In other words, in the old overdrive scheme already described, the effect of increase of the voltage applied to the ferro-electric capacitor is not demonstrated sufficiently (FIG. 2).

In order to solve the above-described problem, an object of the present invention is to provide a scheme in which the capacitor for coupling is not added and the loss of the signal quantity Vsigwin caused by bit line capacitance increase is suppressed (FIG. 2).

Hereafter, embodiments according to the present invention will be described with reference to the drawings.

First Embodiment

Figure 3:
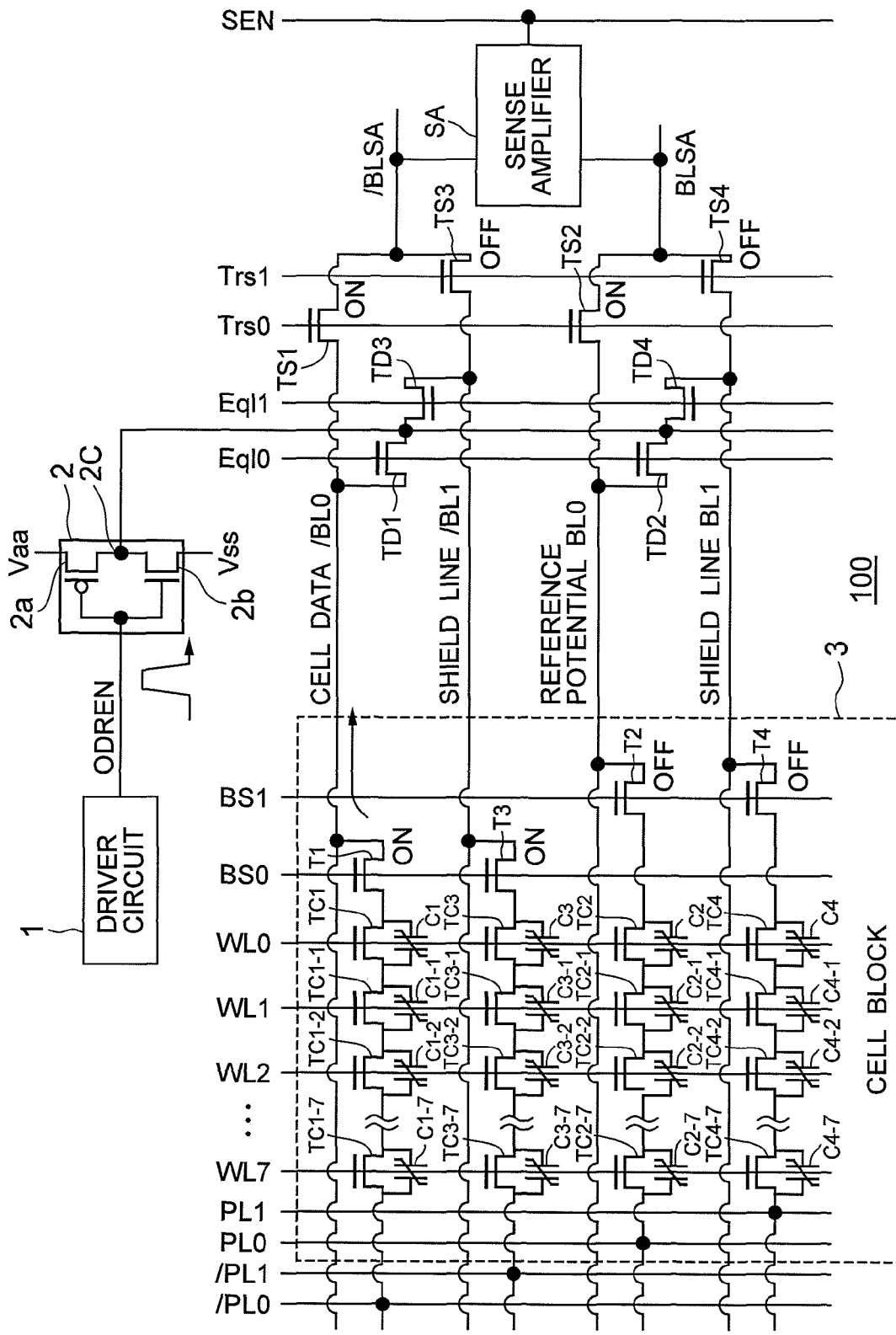
FIG. 3 is a circuit diagram showing an example of a configuration of a ferro-electric random access memory apparatus 100 according to a first embodiment.

FIG. 3 is a circuit diagram showing an example of a configuration of a ferro-electric random access memory apparatus 100 according to a first embodiment.

As shown in FIG. 3, the ferro-electric random access memory apparatus 100 includes a driver circuit 1, an inverter 2, a cell block 3, a sense amplifier SA, first to fourth bit lines /BL0, BL0, /BL1 and BL1, selection lines BS0 and BS1, first to fourth plate lines /PL0, PL0, /PL1 and PL1, first and second sense amplifier bit lines /BLSA and BLSA, word lines WL0 to WL7, changeover lines Eql0 and Eql1, sense changeover lines Trs0 and Trs1, first to fourth sense changeover MOS transistors TS1 to TS4, and first to fourth drive MOS transistors TD1 to TD4.

The driver circuit 1 is adapted to output a bit line potential control signal ODREN.

The inverter 2 is adapted to invert the bit line potential control signal ODREN and output a resultant signal. As shown in FIG. 3, the inverter 2 includes, for example, a pMOS transistor 2a, an nMOS transistor 2b, and an output terminal 2c.

The pMOS transistor 2a is connected at its source to a power supply potential Vaa, connected at its drain to the output terminal 2c, and connected at its gate to the output of the driver circuit 1.

In addition, the nMOS transistor 2b is connected between the output terminal 2c and the ground potential Vss, and connected at its gate to the output of the driver circuit 1.

The bit line potential control signal ODREN is input to gates of the pMOS transistor 2a and the nMOS transistor 2b, and a signal obtained by inverting in logic of the bit line potential control signal ODREN is output from the output terminal 2c.

The first to fourth bit lines are arranged in parallel to each other in the order of the first bit line /BL0, the third bit line /BL1, the second bit line BL0 and the fourth bit line BL1. On one side of the first bit line /BL0, the third bit line /BL1 is disposed to be adjacent to and parallel to the first bit line /BL0. On both sides of the second bit line BL0, the third bit line /BL1 and the fourth bit line BL1 to be adjacent to and parallel to the second bit line BL0.

Only one cell block 3 is shown in FIG. 3 for brevity. The ferro-electric random access memory apparatus 100 includes a plurality of cell blocks arranged in, for example, a longitudinal direction of FIG. 3. In the ferro-electric random access memory apparatus 100, therefore, a plurality of bit lines associated with the plurality of cell blocks are arranged in parallel. In other words, capacitance coupling is generated between these adjacent bit lines.

The first drive MOS transistor TD1 is connected between the first bit line /BL0 and the output terminal 2c. The changeover line Eql0 is connected to the first drive MOS transistor TD1 at its gate.

The second drive MOS transistor TD2 is connected between the second bit line BL0 and the output terminal 2c. The changeover line Eql0 is connected to the second drive MOS transistor TD2 at its gate.

The third drive MOS transistor TD3 is connected between the third bit line /BL1 and the output terminal 2c. The changeover line Eql1 is connected to the third drive MOS transistor TD3 at its gate.

The fourth drive MOS transistor TD4 is connected between the fourth bit line BL1 and the output terminal 2c. The changeover line Eql1 is connected to the fourth drive MOS transistor TD4 at its gate.

Here, for example, the first and second drive MOS transistors TD1 and TD2 are turned off while keeping the third and fourth drive MOS transistors TD3 and TD4 off by controlling potentials on the changeover lines Eql0 and Eql1. As a result, the first and second bit lines /BL0 and BL0 are insulated from the output of the inverter 2 while conduction between the third and fourth bit lines /BL1 and BL1 is maintained. For example, only potentials on the third and fourth bit lines /BL1 and BL1 can be controlled to assume the ground potential (a second potential) Vss according to the bit line potential control signal ODREN output by the driver circuit 1.

The cell block 3 includes first to fourth selection MOS transistors T1 to T4, first ferro-electric capacitors C1, C1-1, C1-2, ... C1-7, second ferro-electric capacitors C2, C2-1, C2-2, ... C2-7, third ferro-electric capacitors C3, C3-1, C3-2, ... C3-7, fourth ferro-electric capacitors C4, C4-1, C4-2, ... C4-7, and MOS transistors TC1, TC1-1, TC1-2, ... TC1-7, TC2, TC2-1, TC2-2, ... TC2-7, TC3, TC3-1, TC3-2, ... TC3-7, TC4, TC4-1, TC4-2, ... TC4-7.

A memory cell array which will be described below includes the cell block 3, the first to fourth bit lines /BL0, BL0, /BL1 and BL1, the selection lines BS0 and BS1, the first to fourth plate lines /PL0, PL0, /PL1 and PL1, and the word lines WL0 to WL7 to select a memory cell.

The first selection MOS transistor T1 is connected between the first bit line /BL0 and the first ferro-electric capacitor C1. The first selection MOS transistor T1 is connected at its gate to the selection line BS0.

The second selection MOS transistor T2 is connected between the second bit line BL0 and the second ferro-electric capacitor C2. The second selection MOS transistor T2 is connected at its gate to the selection line BS1.

The third selection MOS transistor T3 is connected between the third bit line /BL1 and the third ferro-electric capacitor C3. The third selection MOS transistor T3 is connected at its gate to the gate of the first selection MOS transistor T1 (in other words, the selection line BS0 is connected to the gates of the first and third selection MOS transistors T1 and T3).

The fourth selection MOS transistor T4 is connected between the fourth bit line BL1 and the fourth ferro-electric capacitor C4. The fourth selection MOS transistor T4 is connected at its gate to the gate of the second selection MOS transistor T2 (in other words, the selection line BS1 is connected to the gates of the second and fourth selection MOS transistors T2 and T4).

The first ferro-electric capacitors C1, C1-1, C1-2, ... C1-7 are connected in series between the first bit line /BL0 and the first plate line /PL0. The first ferro-electric capacitors C1, C1-1, C1-2, ... C1-7 are connected in parallel with the MOS transistors TC1, TC1-1, TC1-2, ... TC1-7, respectively. For example, a first electrode of the first ferro-electric capacitor C1 is connected to the first bit line /BL0 via the first selection MOS transistor T1. In addition, a second electrode of the first ferro-electric capacitor C1 is connected to the first plate line /PL0 via the MOS transistors TC2-1, TC2-2, ... TC2-7.

For example, the first ferro-electric capacitor C1 and the MOS transistors TC1 (which is connected in parallel with the first ferro-electric capacitor C1) constitute one memory cell (other ferro-electric capacitors also constitute memory cells respectively in the same way).

The second ferro-electric capacitors C2, C2-1, C2-2, ... C2-7 are connected in series between the second bit line BL0 and the second plate line PL0. The second ferro-electric capacitors C2, C2-1, C2-2, ... C2-7 are connected in parallel with the MOS transistors TC2, TC2-1, TC2-2, ... TC2-7, respectively. For example, a first electrode of the second ferro-electric capacitor C2 is connected to the second bit line BL0 via the second selection MOS transistor T2. In addition, a second electrode of the second ferro-electric capacitor C2 is connected to the second plate line PL0 via the MOS transistors TC2-1, TC2-2, ... TC2-7.

The third ferro-electric capacitors C3, C3-1, C3-2, ... C3-7 are connected in series between the third bit line /BL1 and the third plate line /PL1. The third ferro-electric capacitors C3, C3-1, C3-2, ... C3-7 are connected in parallel with the MOS transistors TC3, TC3-1, TC3-2, ... TC3-7, respectively. For example, a first electrode of the third ferro-electric capacitor C3 is connected to the third bit line /BL1 via the third selection MOS transistor T3. In addition, a second electrode of the third ferro-electric capacitor C3 is connected to the third plate line /PL1 via the MOS transistors TC3-1, TC3-2, ... TC3-7.

The fourth ferro-electric capacitors C4, C4-1, C4-2, ... C4-7 are connected in series between the fourth bit line BL1 and the fourth plate line PL1. The fourth ferro-electric capacitors C4, C4-1, C4-2, ... C4-7 are connected in parallel with the MOS transistors TC4, TC4-1, TC4-2, ... TC4-7, respectively. For example, a first electrode of the fourth ferro-electric capacitor C4 is connected to the fourth bit line BL1 via the fourth selection MOS transistor T4. In addition, a second electrode of the fourth ferro-electric capacitor C4 is connected to the fourth plate line PL1 via the MOS transistors TC4-1, TC4-2, ... TC4-7.

The first to fourth ferro-electric capacitors C1, C1-1, C1-2, ... C1-7, C2, C2-1, C2-2, ... C2-7, C3, C3-1, C3-2, ... C3-7, C4, C4-1, C4-2, ... C4-7 are adapted to store data according to a voltage applied between two electrodes and a polarization state depending on the polarity of the voltage.

For example, the potential on the selection line BS0 is set to the "high" level, the potential on the word line WL0 is set to the "low" level, and the potential on the word lines WL1 to WL7 is set to the "high" level. As a result, the first selection MOS transistor T1 and the MOS transistors TC1-1, TC1-2, ... TC1-7 turn on, and the MOS transistor TC1 turns off. As a result, electrical conduction between the first bit line /BL0 and the first electrode of the first ferro-electric capacitor C1 is obtained, and electrical conduction between the first plate line /PL0 and the second electrode of the first ferro-electric capacitor C1 is obtained. By controlling the potential on the first plate line /PL0 in this state, a potential depending on data stored on the first ferro-electric capacitor C1 is applied to the first bit line /BL0.

The first sense changeover MOS transistor TS1 is connected between the first sense amplifier bit line /BLSA and the first bit line /BL0. The sense changeover line Trs0 is connected to the first sense changeover MOS transistor TS1 at its gate.

The second sense changeover MOS transistor TS2 is connected between the second sense amplifier bit line BLSA and the second bit line BL0. The sense changeover line Trs0 is connected to the second sense changeover MOS transistor TS2 at its gate.

The third sense changeover MOS transistor TS3 is connected between the first sense amplifier bit line /BLSA and the third bit line /BL1. The sense changeover line Trs1 is connected to the third sense changeover MOS transistor TS3 at its gate.

The fourth sense changeover MOS transistor TS4 is connected between the second sense amplifier bit line BLSA and the fourth bit line BL1. The sense changeover line Trs1 is connected to the fourth sense changeover MOS transistor TS4 at its gate.

The sense amplifier SA is connected between the first sense amplifier bit line /BLSA and the second sense amplifier bit line BLSA. The sense amplifier SA is adapted to operate according to a sense amplifier drive signal SEN. The sense amplifier SA is activated, for example, when the sense amplifier drive signal SEN is at the "high" level (power supply potential Vaa). On the other hand, the sense amplifier SA is inactivated, for example, when the sense amplifier drive signal SEN is at the "low" level (the ground potential Vss).

Upon being activated, the sense amplifier SA amplifies a potential difference (a signal on a bit line onto which cell data is read) between the first sense amplifier bit line /BLSA and the second sense amplifier bit line BLSA. The amplified potential difference is acquired by a read circuit (not illustrated), and data of a logic corresponding to the potential difference is read by the read circuit.

For example, in order to read data stored on the first ferro-electric capacitor C1, the potential on the plate line /PL0 is controlled and data stored on the first ferro-electric capacitor C1 is read onto the first bit line /BL0. Furthermore, the potential on the second bit line BL0 is used as a reference potential, and the potentials on the first and second bit lines /BL0 and BL0 are sensed and amplified by the sense amplifier SA.

Incidentally, at the time of a 1T1C operation which will be described below, a potential supplied from a dummy cell (not illustrated) or a reference potential generation power supply (not illustrated) is read onto the second bit line BL0 and fixed as a reference potential (fixed potential).

On the other hand, at the time of a 2T2C operation, for example, data from the corresponding second ferro-electric capacitor C2 having data which is inverted data with respect to that of the first ferro-electric capacitor C1 written therein is read onto the second bit line BL0, and it is used as a reference potential. In the 2T2C operation, it is necessary that a potential Vpp is applied not only to the selection line BS0 but also to the selection line BS1 and MOS transistors connected to them are in the on-state.

In FIG. 3, the MOS transistors, the drive MOS transistors, and the sense changeover MOS transistors are n-type MOS transistors. As occasion demands, however, it is also possible to use p-type MOS transistors as these MOS transistors with due regard to the circuit polarities.

Incidentally, the driver circuit 1, the inverter 2, and the first to fourth drive MOS transistors TD1 to TD4 already described constitute a bit line potential control circuit. At the time of data readout, the bit line potential control circuit exercises control to pull down voltage on bit lines adjacent to a bit line from which a signal is to be read, before operation of the sense amplifier as described below. The bit line potential control circuit is disposed between the memory cell array and the sense amplifier.

A readout operation conducted by applying the scheme according to the present invention to the ferro-electric random access memory apparatus 100 having the configuration described heretofore will now be described.

Hereafter, the readout operation will be described by taking the 1T1C operation in which 1-bit data is retained on one ferro-electric capacitor (cell) as an example. Especially, as an example, the case where data on the first ferro-electric capacitor C1 is read will be described. In this example, parasitic capacitances between the third and fourth bit lines /BL1 and BL1 serving as shield lines and the first and second bit lines /BL0 and BL0 from which data is read are used.

For example, when data stored on the first and second ferro-electric capacitors C1 and C2 are read, data is read onto the first and second bit lines /BL0 and BL0 and the third and fourth bit lines /BL1 and BL1 are used as the shield lines. On the other hand, when data stored on the third and fourth ferro-electric capacitors C3 and C4 are read, data is read onto the third and fourth bit lines /BL1 and BL1 and the first and second bit lines /BL0 and BL0 are used as the shield lines.

Here, the shield lines already described are provided to prevent noise from being caused by the parasitic capacitance between bit lines which serve to store data read. The operation principle of the shield lines is disclosed in, for example, K. Hoya, et al., "A 64 Mb chain FeRAM with Quad-BL Architecture and 200 MB/s Burst Mode," ISSCC Dig. Tech. Papers, pp. 459-466, February 2006.

Incidentally, the principle of the scheme according to the present invention is applied to the 2T2C operation as well. In the case of the 2T2C operation, for example, 1-bit data is retained by using two capacitors, i.e., the first and second ferro-electric capacitors C1 and C2, and inverted data of the data retained on the first ferro-electric capacitor C1 is written on the second ferro-electric capacitor C2.

Figure 4:
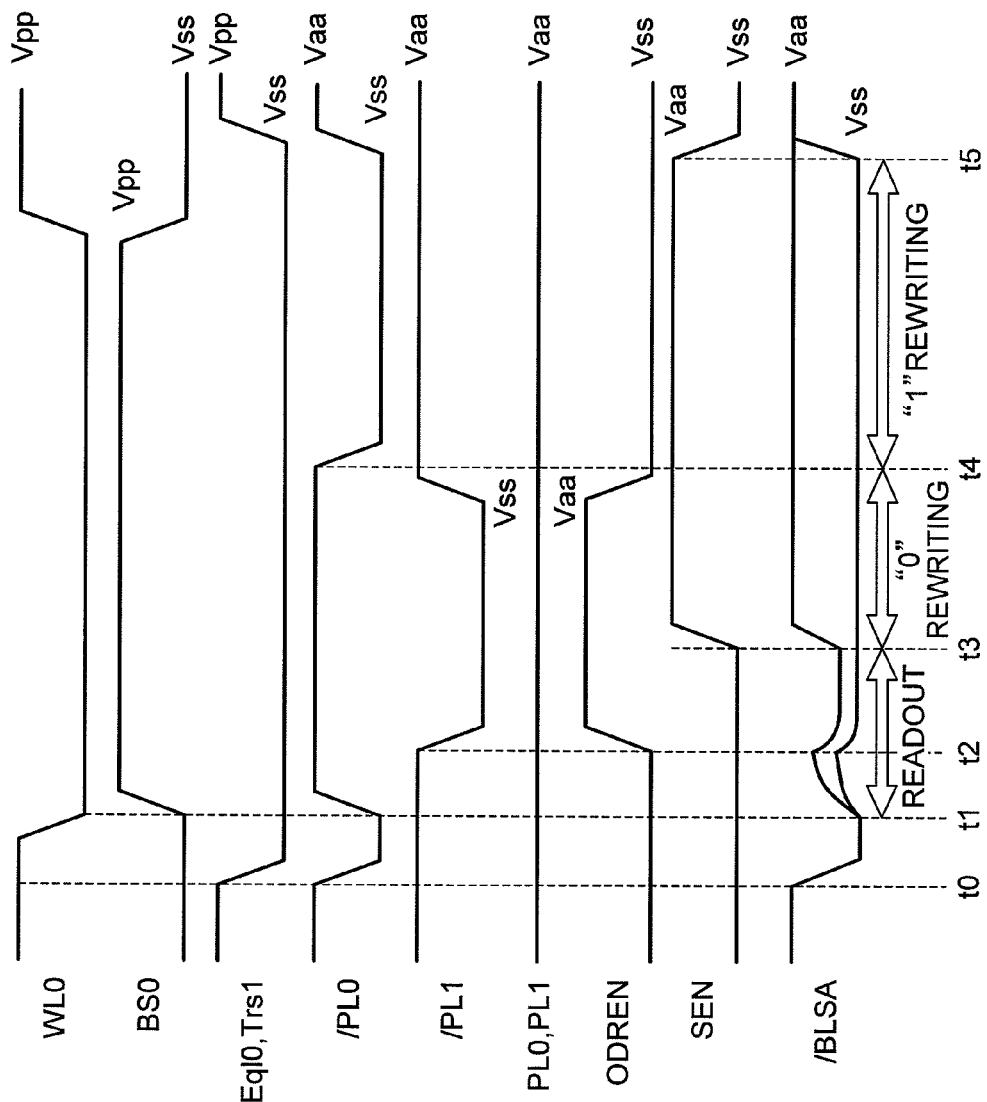
FIG. 4 is a diagram showing a timing chart of potentials on respective signal lines and potential waveforms of respective signals in a cycle of data readout operation from the first ferro-electric capacitor C1 in the ferro-electric random access memory apparatus 100 shown in FIG. 3.

FIG. 4 is a diagram showing a timing chart of potentials on respective signal lines and potential waveforms of respective signals in a cycle of data readout operation from the first ferro-electric capacitor C1 in the ferro-electric random access memory apparatus 100 shown in FIG. 3.

In a standby state (a state after writing is completed) before time t0, the level of the bit line potential control signal ODREN is controlled to assume the ground potential (second potential) Vss, and the word lines WL0 to WL7, the changeover lines Eql0 and Eql1, and the sense changeover lines Trs0 and Trs1 are precharged to the potential Vpp, as shown in FIG. 4.

As a result, the MOS transistors TC1, TC1-1, TC1-2, ... TC1-7, TC2, TC2-1, TC2-2, ... TC2-7, TC3, TC3-1, TC3-2, ... TC3-7, TC4, TC4-1, TC4-2, ... TC4-7, the first to fourth drive MOS transistors TD1 to TD4, and the first to fourth sense changeover MOS transistors TS1 to TS4 are in the on-state.

Furthermore, the selection lines BS0 and BS1 are controlled to assume the ground potential Vss. As a result, the first to fourth selection MOS transistors T1 to T4 are in the off-state in the standby state.

In addition, all of the first to fourth bit lines /BL0, BL0, /BL1 and BL1, the first and second sense amplifier bit lines /BLSA and BLSA, and the first to fourth plate lines /PL0, PL0, /PL1 and PL1 are precharged to the power supply potential (first potential) Vaa.

When reading data from the first ferro-electric capacitor C1, the potential on the changeover line Eql0 is controlled to assume the ground potential Vss at time t0. As a result, the first and second bit lines /BL0 and BL0 are insulated from the output terminal 2c of the inverter 2.

At this time, the sense changeover line Trs1 is discharged to the ground potential Vss, and the third and fourth sense changeover MOS transistors TS3 and TS4 turn off. As a result, the third and fourth bit lines /BL1 and BL1 are insulated from the first and second sense amplifier bit lines /BLSA and BLSA, and the first and second bit lines /BL0 and BL0, respectively.

In addition, the potential on the first plate line /PL0 is controlled to change from the power supply potential Vaa to the ground potential Vss. In addition, the first and second sense amplifier bit lines /BLSA and BLSA are discharged to the ground potential Vss by the sense amplifier SA.

Then, at time t1, the word line WL0 is controlled to assume the ground potential Vss and consequently the MOS transistor TC1 turns off. In other words, a column of the first ferro-electric capacitor C1 is selected.

In addition, at the time t1, the selection line BS0 is charged to the potential Vpp and consequently the first and third selection MOS transistors T1 and T3 turn on. In addition, the first plate line /PL0 is controlled to assume the power supply potential Vaa. As a result, data stored on the first ferro-electric capacitor C1 is read onto the first bit line /BL0. At this time, the first and second sense changeover MOS transistors TS1 and TS2 remain on, and consequently there is conduction between the first bit line /BL0 and the first sense amplifier bit line /BLSA. In other words, the potential on the first sense amplifier bit line /BLSA changes according to the data stored on the first ferro-electric capacitor C1 (after the time t1).

Then, at time t2, the level of the bit line potential control signal ODREN is controlled to assume the power supply potential Vaa by the driver circuit 1 (in other words, the potential on the output terminal 2c of the inverter 2 is controlled to assume the ground potential Vss).

As a result, the potential on the third and fourth bit lines /BL1 and BL1 which serve as the shield lines is changed to the ground potential Vss.

In this way, the potential on the third and fourth bit lines /BL1 and BL1 which serve as the shield lines is changed to the ground potential Vss according to the bit line potential control signal ODREN.

As a result, the potential on the first bit line /BL0 is lowered (kicked downward) by capacitance coupling between adjacent bit lines.

Therefore, the potential difference between the first plate line /PL0 and the first bit line /BL0 becomes greater. In other words, the voltage applied between electrodes of the first ferro-electric capacitor C1 increases, and more charges on the first ferro-electric capacitor C1 are read onto the bit line /BL0. As a result, the signal quantity Vsigwin of the ferro-electric random access memory apparatus 100 already described increases.

At the time t2, not only the potential of the bit line potential control signal ODREN but also the potential on the third plate line /PL1 is controlled. In other words, when the potential on the third and fourth bit lines /BL1 and BL1 is changed from the power supply potential Vaa to the ground potential Vss, the potential on the third plate line /PL1 is changed to the ground potential Vss. Since the selection line BS0 assumes the potential Vpp as already described, the third selection MOS transistor T3 connected at its gate to the selection line BS0 is in the on-state. As a result, the potential on the third bit line /BL1 becomes equal to that on the third plate line /PL1. As a result, it is prevented that a bias potential is applied to the third ferro-electric capacitor C3 and data in the third ferro-electric capacitor C3 is rewritten. In other words, false writing of data onto the third ferro-electric capacitor C3 which is not the object of readout can be prevented.

Then, at time t3, the potential of the sense amplifier drive signal SEN is controlled to assume the power supply potential Vaa and consequently the sense amplifier SA is started (activated). The potential on the first sense amplifier bit line /BLSA (the first bit line /BL0) sensed by the sense amplifier SA is amplified to the ground potential Vss when the data stored on the first ferro-electric capacitor C1 is "1," whereas it is amplified to the power supply potential Vaa when the data stored on the first ferro-electric capacitor C1 is "0."

Over a time period between the time t3 and time t4 when the potential on the first plate line /PL0 is controlled to assume the ground potential Vss, the sense amplifier SA is in the driven state. If the data stored on the first ferro-electric capacitor C1 is "0," then the time period is a time period for rewriting "0" onto the first ferro-electric capacitor C1.

During the "0" rewriting time period, the level of the bit line potential control signal ODREN is controlled to assume the ground potential Vss, and in addition, the third plate line /PL1 is charged to the power supply potential Vaa. Then, at the time t4, the first plate line /PL0 is discharged to the ground potential Vss and thereby the "0" rewriting time period is finished.

At the time t4, the sense amplifier SA is in the driven state and the potential on the first plate line /PL0 is dropped to the ground potential Vss. If the data stored on the first ferro-electric capacitor C1 is "1," then rewriting "1" onto the first ferro-electric capacitor C1 is started (from time t4 on). The "1" rewriting lasts until the potential of the sense amplifier drive signal SEN becomes the ground potential Vss and the sense amplifier SA is inactivated (until time t5).

As a result of the operation described heretofore, the cycle of the readout operation of data from the first ferro-electric capacitor C1 in the ferro-electric random access memory apparatus 100 is finished.

In the old overdrive scheme of the comparative example already described, the capacitor for coupling is added. Therefore, the effective bit line capacitance Cb' is increased by the coupling capacitance. Therefore, there is a problem that the signal quantity of the ferro-electric random access memory apparatus is decreased and the effect of the old overdrive scheme is lowered as already described. In addition, there is a problem that the area cost of the coupling capacitance is generated.

On the other hand, the scheme in which the capacitor for coupling is not added is proposed in the present embodiment. Since the bit line capacitance is not increased as a result, the ferro-electric capacitor can be controlled without decreasing the signal quantity and a greater signal quantity can be obtained as compared with the comparative example already described (FIG. 2). In addition, since the capacitor for coupling is not added, the increase of the area of the circuit can be suppressed as compared with the comparative example already described.

According to the ferro-electric random access memory apparatus in the present embodiment, the gain of the cell signal quantity can be increased while suppressing the increase of the area of the circuit.

Second Embodiment

In the first embodiment, the configuration in which two selection MOS transistors are controlled by one selection line in order to reduce the circuit area has been described.

However, one selection MOS transistor may be controlled by one selection line.

In the present second embodiment, therefore, an example of a ferro-electric random access memory apparatus in which one selection MOS transistor is controlled by one selection line will be described.

Figure 5:
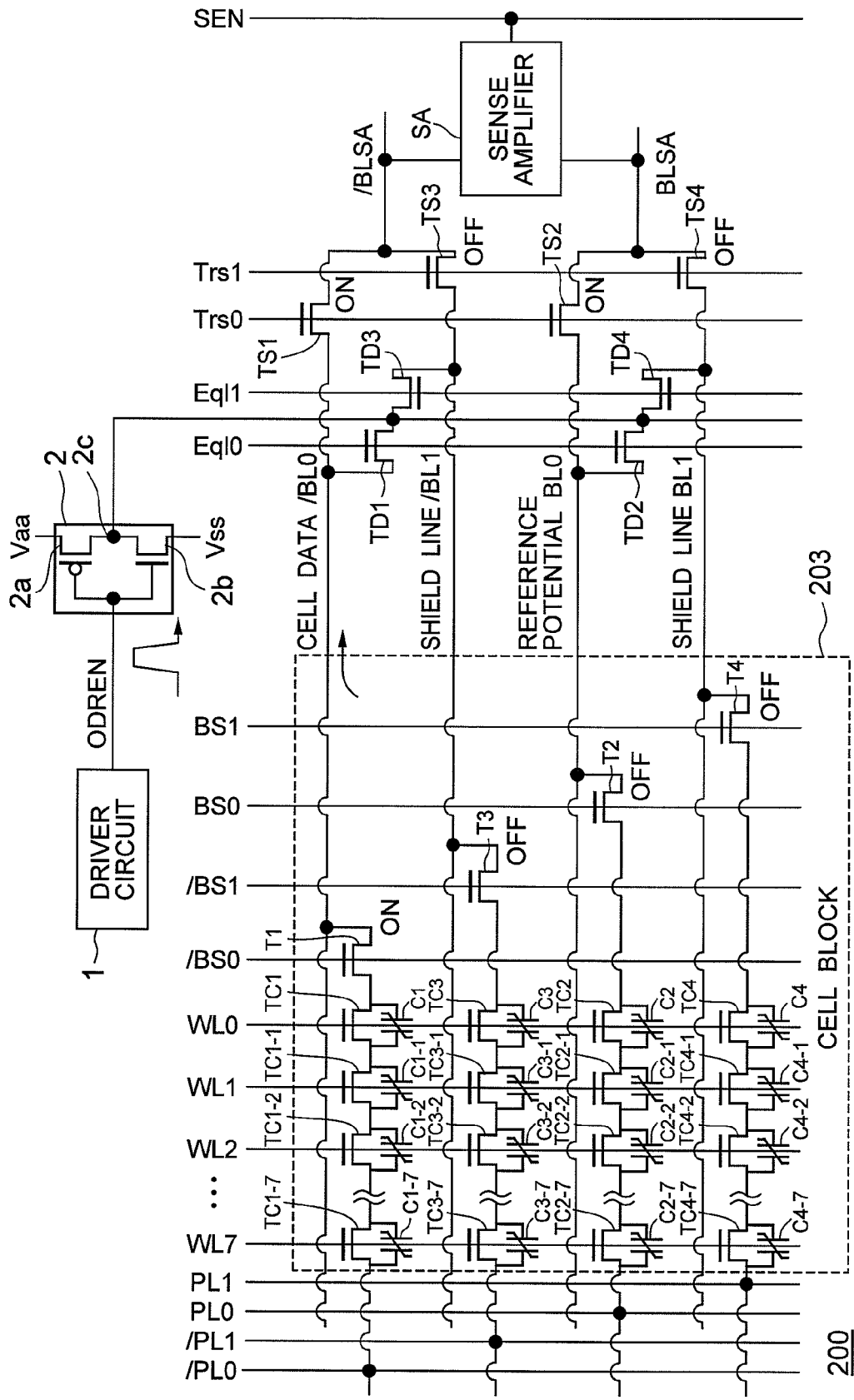
FIG. 5 is a circuit diagram showing an example of a configuration of a ferro-electric random access memory apparatus 200 according to the second embodiment.

FIG. 5 is a circuit diagram showing an example of a configuration of a ferro-electric random access memory apparatus 200 according to the second embodiment. Only one cell block 203 is shown in FIG. 5 for brevity. The ferro-electric random access memory apparatus 200 includes a plurality of cell blocks 203 arranged, for example, in the longitudinal direction in FIG. 5. In FIG. 5, components denoted by the same characters as those shown in FIG. 3 are components which are like those in the ferro-electric random access memory apparatus 100 in the first embodiment.

As shown in FIG. 5, the ferro-electric random access memory apparatus 200 includes a driver circuit 1, an inverter 2, a cell block 203, a sense amplifier SA, first to fourth bit lines /BL0, BL0, /BL1 and BL1, selection lines /BS0, BS0, /BS1 and BS1, first to fourth plate lines /PL0, PL0, /PL1 and PL1, first and second sense amplifier bit lines /BLSA and BLSA, word lines WL0 to WL7, changeover lines Eql0 and Eql1, sense changeover lines Trs0 and Trs1, first to fourth sense changeover MOS transistors TS1 to TS4, and first to fourth drive MOS transistors TD1 to TD4.

The cell block 203 includes first to fourth selection MOS transistors T1 to T4, first ferro-electric capacitors C1, C1-1, C1-2, . . . C1-7, second ferro-electric capacitors C2, C2-1, C2-2, . . . C2-7, third ferro-electric capacitors C3, C3-1, C3-2, . . . C3-7, fourth ferro-electric capacitors C4, C4-1, C4-2, . . . C4-7, and MOS transistors TC1, TC1-1, TC1-2, . . . TC1-7, TC2, TC2-1, TC2-2, . . . TC2-7, TC3, TC3-1, TC3-2, . . . TC3-7, TC4, TC4-1, TC4-2, . . . TC4-7.

The first selection MOS transistor T1 is connected between the first bit line /BL0 and the first ferro-electric capacitor C1. The first selection MOS transistor T1 is connected at its gate to the selection line /BS0.

The second selection MOS transistor T2 is connected between the second bit line BL0 and the second ferro-electric capacitor C2. The second selection MOS transistor T2 is connected at its gate to the selection line BS0.

The third selection MOS transistor T3 is connected between the third bit line /BL1 and the third ferro-electric capacitor C3. The third selection MOS transistor T3 is connected at its gate to the selection line /BS1.

The fourth selection MOS transistor T4 is connected between the fourth bit line BL1 and the fourth ferro-electric capacitor C4. The fourth selection MOS transistor T4 is connected at its gate to the selection line BS1.

In this way, the ferro-electric random access memory apparatus 200 differs from the ferro-electric random access memory apparatus 100 in the first embodiment that the ferro-electric random access memory apparatus 200 includes four selection lines /BS0, BS0, /BS1 and BS1. The first to fourth selection MOS transistors T1 to T4 are controlled by these four selection lines /BS0, BS0, /BS1 and BS1, respectively.

Other configurations of the ferro-electric random access memory apparatus 200 are the same as those of the ferro-electric random access memory apparatus 100 according to the first embodiment.

A readout operation conducted by applying the scheme according to the present invention to the ferro-electric random access memory apparatus 200 having the configuration described heretofore will now be described.

Hereafter, the readout operation will be described by taking the 1T1C operation in which 1-bit data is retained on one ferro-electric capacitor (cell) as an example. Especially, as an example, the case where data on the first ferro-electric capacitor C1 is read will be described.

Figure 6:
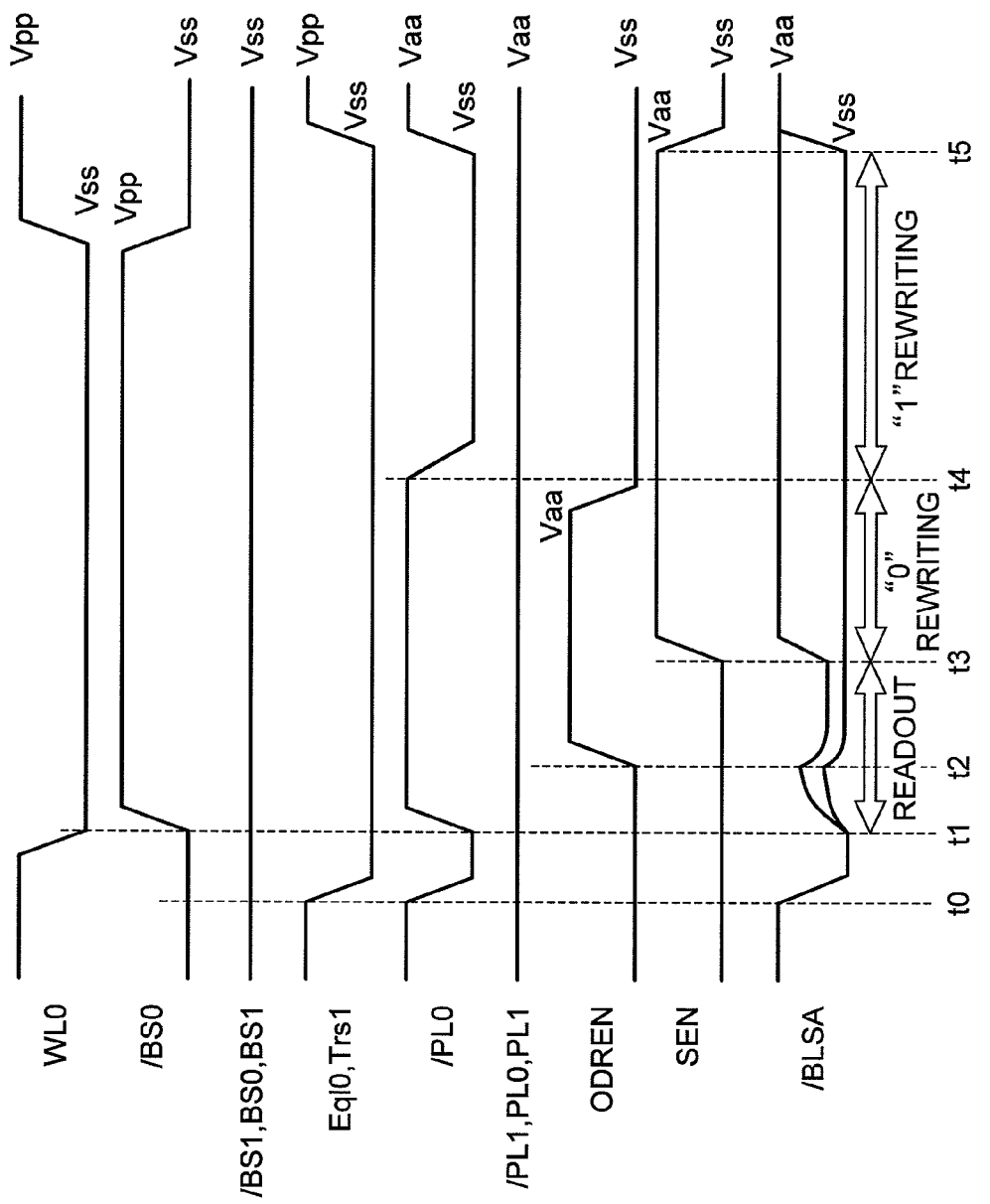
FIG. 6 is a diagram showing a timing chart of potentials on respective signal lines and potential waveforms of respective signals in a cycle of data readout operation from the first ferro-electric capacitor C1 in the ferro-electric random access memory apparatus 200 shown in FIG. 5.

FIG. 6 is a diagram showing a timing chart of potentials on respective signal lines and potential waveforms of respective signals in a cycle of data readout operation from the first ferro-electric capacitor C1 in the ferro-electric random access memory apparatus 200 shown in FIG. 5.

In a standby state (a state after writing is completed) before time t0, the level of the bit line potential control signal ODREN is controlled to assume the ground potential (second potential) Vss, and the word lines WL0 to WL7, the changeover lines Eql0 and Eql1, and the sense changeover lines Trs0 and Trs1 are precharged to the potential Vpp, as shown in FIG. 6.

As a result, the MOS transistors TC1, TC1-1, TC1-2, ... TC1-7, TC2, TC2-1, TC2-2, ... TC2-7, TC3, TC3-1, TC3-2, ... TC3-7, TC4, TC4-1, TC4-2, ... TC4-7, the first to fourth drive MOS transistors TD1 to TD4, and the first to fourth sense changeover MOS transistors TS1 to TS4 are in the on-state.

Furthermore, the selection lines /BS0, BS0, /BS1 and BS1 are controlled to assume the ground potential Vss. As a result, the first to fourth selection MOS transistors T1 to T4 are in the off-state in the standby state.

In addition, all of the first to fourth bit lines /BL0, BL0, /BL1 and BL1, the first and second sense amplifier bit lines /BLSA and BLSA, and the first to fourth plate lines /PL0, PL0, /PL1 and PL1 are precharged to the power supply potential (first potential) Vaa.

When reading the first ferro-electric capacitor C1, the potential on the changeover line Eql0 is controlled to assume the ground potential Vss at time t0. As a result, the first and second bit lines /BL0 and BL0 are insulated from the output terminal 2c of the inverter 2.

At this time, the sense changeover line Trs1 is discharged to the ground potential Vss, and the third and fourth sense changeover MOS transistors TS3 and TS4 turn off. As a result, the third and fourth bit lines /BL1 and BL1 are insulated from the first and second sense amplifier bit lines /BLSA and BLSA, and the first and second bit lines /BL0 and BL0, respectively.

In addition, the potential on the first plate line /PL0 is controlled to change from the power supply potential Vaa to the ground potential Vss. In addition, the first and second sense amplifier bit lines /BLSA and BLSA are discharged to the ground potential Vss by the sense amplifier SA.

Then, at time t1, the word line WL0 is controlled to assume the ground potential Vss and consequently the MOS transistor TC1 turns off. In other words, a column of the first ferro-electric capacitor C1 is selected.

In addition, at the time t1, the selection line /BS0 is charged to the potential Vpp and consequently only the first selection MOS transistor T1 turns on. In addition, the first plate line /PL0 is controlled to assume the power supply potential Vaa. As a result, data stored on the first ferro-electric capacitor C1 is read onto the first bit line /BL0. At this time, the first and second sense changeover MOS transistors TS1 and TS2 remain on, and consequently there is conduction between the first bit line /BL0 and the first sense amplifier bit line /BLSA. In other words, the potential on the first sense amplifier bit line /BLSA changes according to the data stored on the first ferro-electric capacitor C1 (after the time t1).

Then, at time t2, the level of the bit line potential control signal ODREN is controlled to assume the power supply potential Vaa by the driver circuit 1 (in other words, the potential on the output terminal 2c of the inverter 2 is controlled to assume the ground potential Vss). As a result, the potential on the third and fourth bit lines /BL1 and BL1 which serve as the shield lines is changed to the ground potential Vss.

In this way, the potential on the third and fourth bit lines /BL1 and BL1 which serve as the shield lines is changed to the ground potential Vss according to the bit line potential control signal ODREN.

As a result, the potential on the first bit line /BL0 is lowered (kicked downward) by capacitance coupling between adjacent bit lines.

Therefore, the potential difference between the first plate line /PL0 and the first bit line /BL0 becomes greater. In other words, the voltage applied between electrodes of the first ferro-electric capacitor C1 increases. As a result, the signal quantity Vsigwin of the ferro-electric random access memory apparatus 200 already described increases.

Then, at time t3, the potential of the sense amplifier drive signal SEN is controlled to assume the power supply potential Vaa and consequently the sense amplifier SA is started (activated). The potential on the first sense amplifier bit line /BLSA (the first bit line /BL0) sensed by the sense amplifier SA is amplified to the ground potential Vss when the data stored on the first ferro-electric capacitor C1 is "0," whereas it is amplified to the power supply potential Vaa when the data stored on the first ferro-electric capacitor C1 is "1."

Over a time period between the time t3 and time t4 when the potential on the first plate line /PL0 is controlled to assume the ground potential Vss, the sense amplifier SA is in the driven state. If the data stored on the first ferro-electric capacitor C1 is "0," then the time period is a time period for rewriting "0" onto the first ferro-electric capacitor C1.

During the "0" rewriting time period, the level of the bit line potential control signal ODREN is controlled to assume the ground potential Vss. Then, at the time t4, the first plate line /PL0 is discharged to the ground potential Vss and thereby the "0" rewriting time period is finished.

At the time t4, the sense amplifier SA is in the driven state and the potential on the first plate line /PL0 is dropped to the ground potential Vss. If the data stored on the first ferro-electric capacitor C1 is "1," then rewriting "1" onto the first ferro-electric capacitor C1 is started (from time t4 on). The "1" rewriting lasts until the potential of the sense amplifier drive signal SEN becomes the ground potential Vss and the sense amplifier SA is inactivated (until time t5).

As a result of the operation described heretofore, the cycle of the readout operation of data from the first ferro-electric capacitor C1 in the ferro-electric random access memory apparatus 200 is finished.

In the first embodiment, the first and third selection MOS transistors T1 and T3 respectively associated with the first and third ferro-electric capacitors C1 and C3 are connected to the selection line BS0 as already described (FIG. 3).

For example, therefore, it is necessary to control the third plate line /PL1 besides the bit line potential control signal ODREN at the time t2 already described and shown in FIG. 4 in order to prevent false writing of data onto the third ferro-electric capacitor C3.

On the other hand, in the present second embodiment, the selection lines /BS0, /BS1, BS0, and BS1 are respectively connected to the first to fourth selection MOS transistors T1 to T4 respectively associated with the first to fourth ferro-electric capacitors C1 to C4 (FIG. 5). In other words, the first to fourth selection MOS transistors T1 to T4 can be controlled individually by the four selection lines /BS0, BS0, /BS1 and BS1, respectively.

As a result, the third plate line /PL1 can be held in a state in which it is precharged to the power supply voltage Vaa at the time t2 as shown in FIG. 6. In other words, it is not necessary to forcibly control the potential on the third plate line /PL1 at the time t2.

In the present second embodiment, the scheme in which the capacitor for coupling is not added is proposed in the same way as the first embodiment as already described. As a result, the bit line capacitance does not increase. Therefore, the ferro-electric capacitor can be controlled without decreasing the signal quantity and a greater signal quantity can be obtained as compared with the comparative example already described (FIG. 2). In addition, since the capacitor for coupling is not added, the increase of the area of the circuit can be suppressed as compared with the comparative example already described.

According to the ferro-electric random access memory apparatus in the present embodiment, the gain of the cell signal quantity can be increased while suppressing the increase of the circuit area as described heretofore.

Third Embodiment

In the first and second embodiments already described, the ferro-electric random access memory apparatus in which a ferro-electric capacitor and a MOS transistor are connected in parallel to constitute a cell unit and a plurality of cell units are connected in series to constitute a chain-like configuration has been described.

In the present third embodiment, an example of a ferro-electric random access memory apparatus including cell blocks each having a configuration which is different from that in the first and second embodiments will be described.

Figure 7:
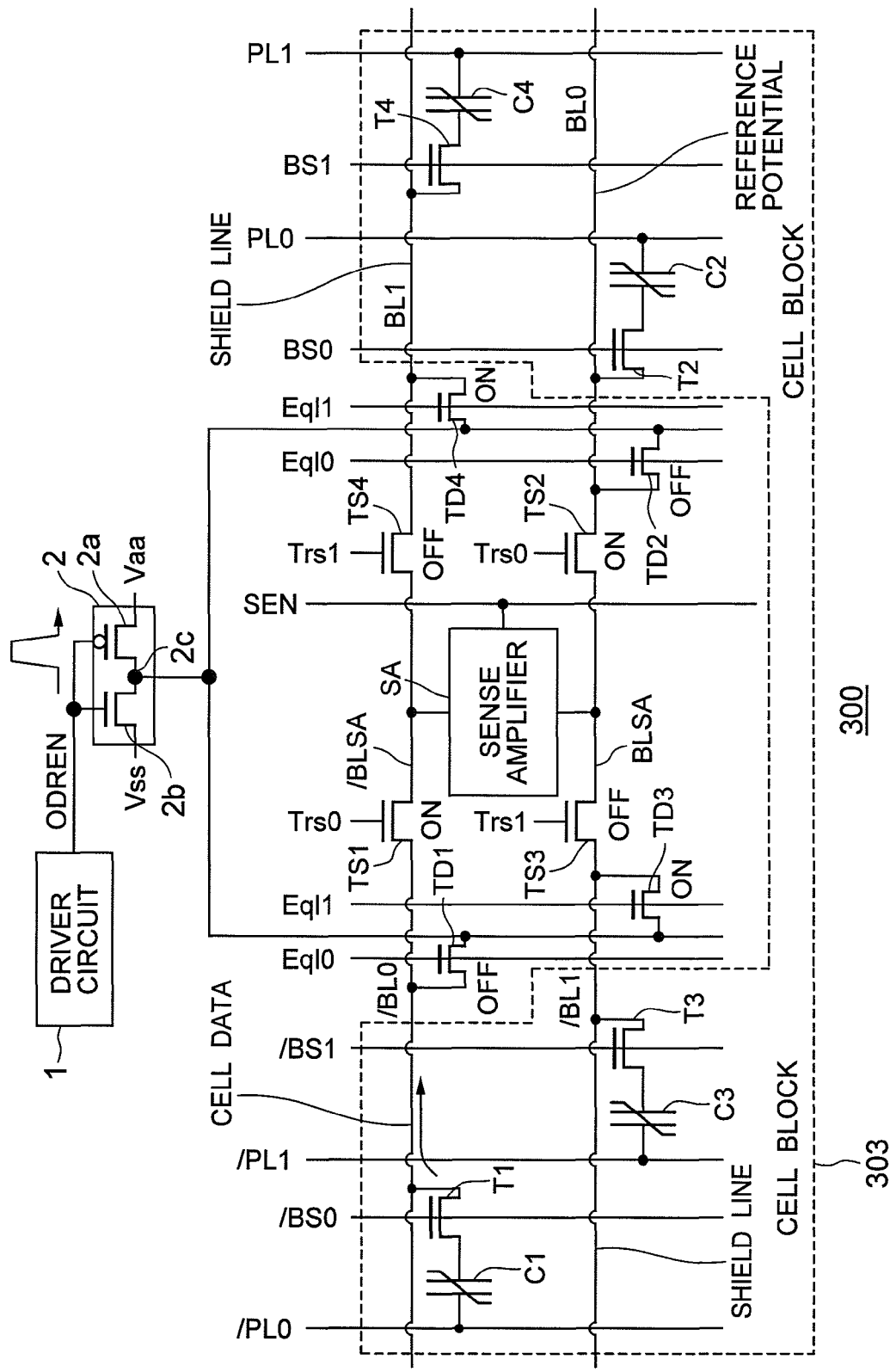
FIG. 7 is a circuit diagram showing an example of a configuration of a ferro-electric random access memory apparatus 300 according to the third embodiment.

FIG. 7 is a circuit diagram showing an example of a configuration of a ferro-electric random access memory apparatus 300 according to the third embodiment. In FIG. 7, components denoted by the same characters as those shown in FIG. 5 are components which are like those in the ferro-electric random access memory apparatus 200 in the second embodiment.

As shown in FIG. 7, the ferro-electric random access memory apparatus 300 includes a driver circuit 1, an inverter 2, a cell block 303, a sense amplifier SA, first to fourth bit lines /BL0, BL0, /BL1 and BL1, selection lines /BS0, BS0, /BS1 and BS1, first to fourth plate lines /PL0, PL0, /PL1 and PL1, first and second sense amplifier bit lines /BLSA and BLSA, changeover lines Eql0 and Eql1, sense changeover lines Trs0 and Trs1, first to fourth sense changeover MOS transistors TS1 to TS4, and first to fourth drive MOS transistors TD1 to TD4.

The first bit line /BL0 is disposed on the same straight line as the fourth bit line BL1 in parallel to the fourth bit line BL1.

The second bit line BL0 is disposed on the same straight line as the third bit line /BL1 in parallel to the first and third bit lines /BL0 and /BL1.

The third bit line /BL1 is disposed to be adjacent to the first bit line /BL0 in parallel to the first bit line /BL0.

The fourth bit line BL1 is disposed to be adjacent to the second bit line BL0 in parallel to the second bit line BL0.

Only one cell block 303 is shown in FIG. 7 for brevity. The ferro-electric random access memory apparatus 300 includes a plurality of cell blocks 303 arranged in, for example, a longitudinal direction of FIG. 7. In the ferro-electric random access memory apparatus 300, therefore, a plurality of bit lines associated with the plurality of cell blocks are arranged in parallel. In other words, capacitance coupling is generated between these adjacent bit lines.

The cell block 303 includes first to fourth selection MOS transistors T1 to T4, a first ferro-electric capacitor C1, a second ferro-electric capacitor C2, a third ferro-electric capacitor C3, and a fourth ferro-electric capacitor C4.

In the cell block 303, the first ferro-electric capacitor C1 and the first selection MOS transistor T1 are connected in series between the first plate line /PL0 and the first bit line /BL0.

In the same way, the second ferro-electric capacitor C2 and the second selection MOS transistor T2 are connected in series between the second plate line PL0 and the second bit line BL0.

In the same way, the third ferro-electric capacitor C3 and the third selection MOS transistor T3 are connected in series between the third plate line /PL1 and the third bit line /BL1.

In the same way, the fourth ferro-electric capacitor C4 and the fourth selection MOS transistor T4 are connected in series between the fourth plate line PL1 and the fourth bit line BL1.

In this way, one ferro-electric capacitor is connected for each pair of a bit line and a plate line in the ferro-electric random access memory apparatus 300.

Other configurations of the ferro-electric random access memory apparatus 300 are the same as those of the ferro-electric random access memory apparatus 200 according to the second embodiment.

A readout operation conducted by applying the scheme according to the present invention to the ferro-electric random access memory apparatus 300 having the configuration described heretofore will now be described.

Hereafter, the readout operation will be described by taking the 1T1C operation in which 1-bit data is retained on one ferro-electric capacitor (cell) as an example. Especially, as an example, the case where data on the first ferro-electric capacitor C1 is read will be described.

Figure 8:
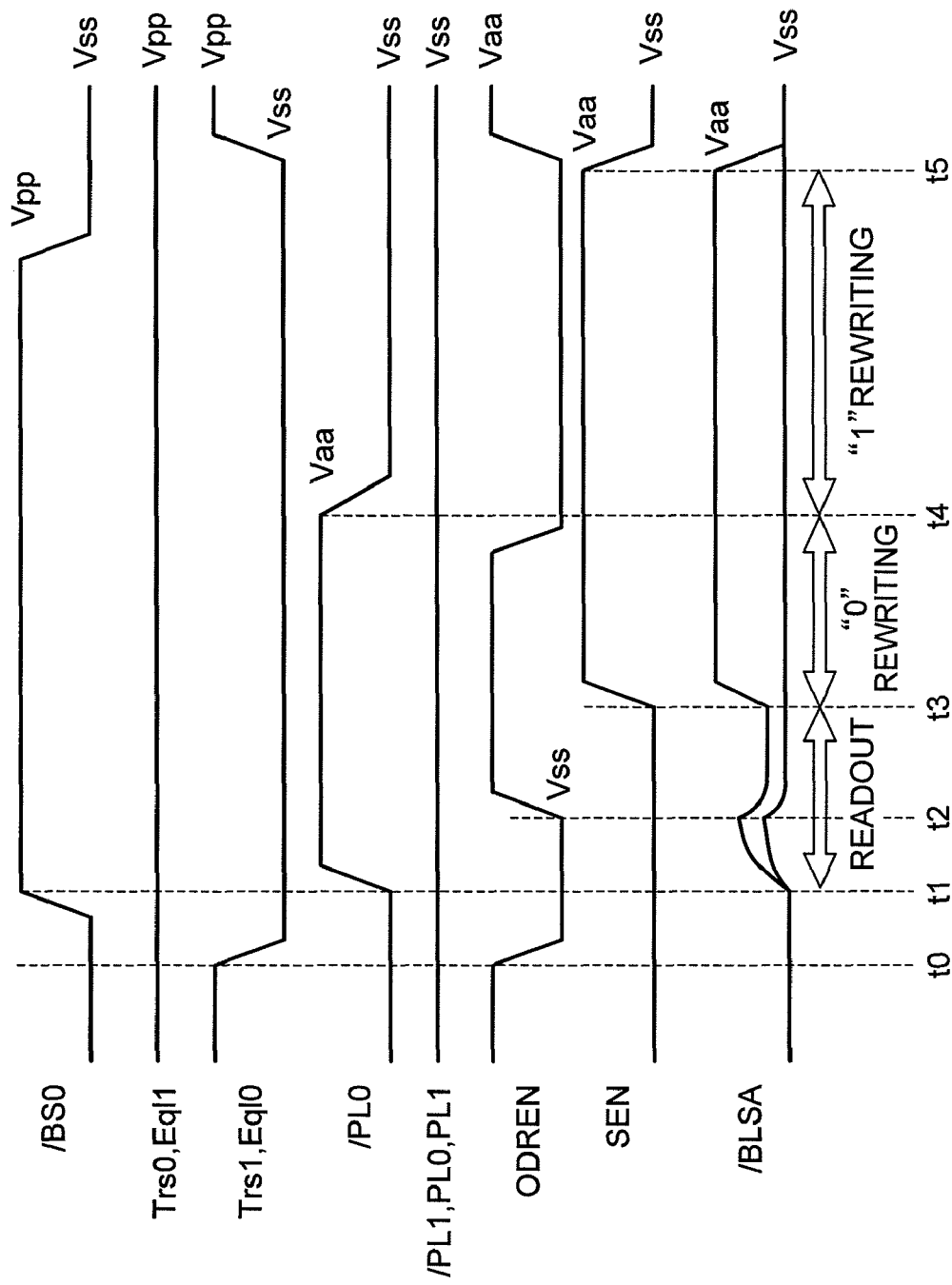
FIG. 8 is a diagram showing a timing chart of potentials on respective signal lines and potential waveforms of respective signals in a cycle of data readout operation from the first ferro-electric capacitor C1 in the ferro-electric random access memory apparatus 300 shown in FIG. 7.

FIG. 8 is a diagram showing a timing chart of potentials on respective signal lines and potential waveforms of respective signals in a cycle of data readout operation from the first ferro-electric capacitor C1 in the ferro-electric random access memory apparatus 300 shown in FIG. 7.

In a standby state (a state after writing is completed) before time t0, the level of the bit line potential control signal ODREN is controlled to assume the power supply potential Vaa, and the changeover lines Eql0 and Eql1, and the sense changeover lines Trs0 and Trs1 are precharged to the potential Vpp, as shown in FIG. 8.

As a result, the first to fourth drive MOS transistors TD1 to TD4, and the first to fourth sense changeover MOS transistors TS1 to TS4 are in the on-state.

Therefore, the first to fourth bit lines /BL0, BL0, /BL1 and BL1, and the first and second sense amplifier bit lines /BLSA and BLSA are discharged to the ground potential (second potential) Vss.

The selection lines /BS0, BS0, /BS1 and BS1 are controlled to assume the ground potential Vss. In the standby state, therefore, the first to fourth selection MOS transistors T1 to T4 are in the off-state.

In addition, the first to fourth plate lines /PL0, PL0, /PL1 and PL1 are precharged to the ground potential Vss.

When reading the first ferro-electric capacitor C1, the potential on the changeover line Eql0 is controlled to assume the ground potential Vss at time t0. As a result, the first and second bit lines /BL0 and BL0 are insulated from the output terminal 2c of the inverter 2.

At this time, the sense changeover line Trs1 is discharged to the ground potential Vss, and the third and fourth sense changeover MOS transistors TS3 and TS4 turn off. As a result, the third and fourth bit lines /BL1 and BL1 are insulated from the first and second sense amplifier bit lines /BLSA and BLSA, and the first and second bit lines /BL0 and BL0, respectively.

Incidentally, the third and fourth drive MOS transistors TD3 and TD4 are in the on-state. The third and fourth bit lines /BL1 and BL1 serving as shield lines are discharged to the ground potential Vss by controlling the level of the bit line potential control signal ODREN to assume the power supply potential Vss.

In addition, the first and second sense amplifier bit lines /BLSA and BLSA are discharged to the ground potential Vss by the sense amplifier SA.

Then, at time t1, the selection line /BS0 is charged to the potential Vpp and consequently only the first selection MOS transistor T1 turns on. In addition, the first plate line /PL0 is controlled to assume the power supply potential Vaa. As a result, data stored on the first ferro-electric capacitor C1 is read onto the first bit line /BL0. At this time, the first and second sense changeover MOS transistors TS1 and TS2 remain on, and consequently there is conduction between the first bit line /BL0 and the first sense amplifier bit line /BLSA. In other words, the potential on the first sense amplifier bit line /BLSA changes according to the data stored on the first ferro-electric capacitor C1 (after the time t1).

Then, at time t2, the level of the bit line potential control signal ODREN is controlled to assume the power supply potential Vaa by the driver circuit 1 (in other words, the potential on the output terminal 2c of the inverter 2 is controlled to assume the ground potential Vss). As a result, the potential on the third and fourth bit lines /BL1 and BL1 which serve as the shield lines is changed to the ground potential Vss.

In this way, the potential on the third and fourth bit lines /BL1 and BL1 which serve as the shield lines is changed to the ground potential Vss according to the bit line potential control signal ODREN.

As a result, the potential on the first bit line /BL0 is lowered (kicked downward) by capacitance coupling between adjacent bit lines.

Therefore, the potential difference between the first plate line /PL0 and the first bit line /BL0 becomes greater. In other words, the voltage applied between electrodes of the first ferro-electric capacitor C1 increases. As a result, the signal quantity Vsigwin of the ferro-electric random access memory apparatus 300 already described increases.

Then, at time t3, the potential of the sense amplifier drive signal SEN is controlled to assume the power supply potential Vaa and consequently the sense amplifier SA is started (activated). The potential on the first sense amplifier bit line /BLSA (the first bit line /BL0) sensed by the sense amplifier SA is amplified to the ground potential Vss when the data stored on the first ferro-electric capacitor C1 is "0," whereas it is amplified to the power supply potential Vaa when the data stored on the first ferro-electric capacitor C1 is "1."

Over a time period between the time t3 and time t4 when the potential on the first plate line /PL0 is controlled to assume the ground potential Vss, the sense amplifier SA is in the driven state. If the data stored on the first ferro-electric capacitor C1 is "0," then the time period is a time period for rewriting "0" onto the first ferro-electric capacitor C1.

During the "0" rewriting time period, the level of the bit line potential control signal ODREN is controlled to assume the ground potential Vss. Then, at the time t4, the first plate line /PL0 is discharged to the ground potential Vss and thereby the "0" rewriting time period is finished.

At the time t4, the sense amplifier SA is in the driven state and the potential on the first plate line /PL0 is dropped to the ground potential Vss. If the data stored on the first ferro-electric capacitor C1 is "1," then rewriting "1" onto the first ferro-electric capacitor C1 is started (from time t4 on). The "1" rewriting lasts until the potential of the sense amplifier drive signal SEN becomes the ground potential Vss and the sense amplifier SA is inactivated (until time t5).

As a result of the operation described heretofore, the cycle of the readout operation of data from the first ferro-electric capacitor C1 in the ferro-electric random access memory apparatus 300 is finished.

In the present third embodiment, the selection lines /BS0, /BS1, BS0, and BS1 are respectively connected to the first to fourth selection MOS transistors T1 to T4 respectively associated with the first to fourth ferro-electric capacitors C1 to C4 in the same way as the second embodiment (FIG. 7). In other words, the first to fourth selection MOS transistors T1 to T4 can be controlled individually by the four selection lines /BS0, BS0, /BS1 and BS1, respectively.

As a result, the third plate line /PL1 can be held in a state in which it is precharged to the power supply voltage Vaa at the time t2 as shown in FIG. 8. In other words, it is not necessary to forcibly control the potential on the third plate line /PL1 at the time t2.

In the present third embodiment, the scheme in which the capacitor for coupling is not added is proposed as already described in the same way as the first and second embodiments. As a result, the bit line capacitance does not increase. Therefore, the ferro-electric capacitor can be controlled without decreasing the signal quantity and a greater signal quantity can be obtained as compared with the comparative example already described (FIG. 2). In addition, since the capacitor for coupling is not added, the increase of the area of the circuit can be suppressed as compared with the comparative example already described.

According to the ferro-electric random access memory apparatus in the present embodiment, the gain of the cell signal quantity can be increased while suppressing the increase of the circuit area as described heretofore.

Fourth Embodiment

In the first and second embodiments already described, the configuration in which a plurality of ferro-electric capacitors are connected in series (in a chain form) has been described.

In the present fourth embodiment, a configuration in which a plurality of ferro-electric capacitors are connected in parallel (in a ladder form) will be described.

Figure 9:
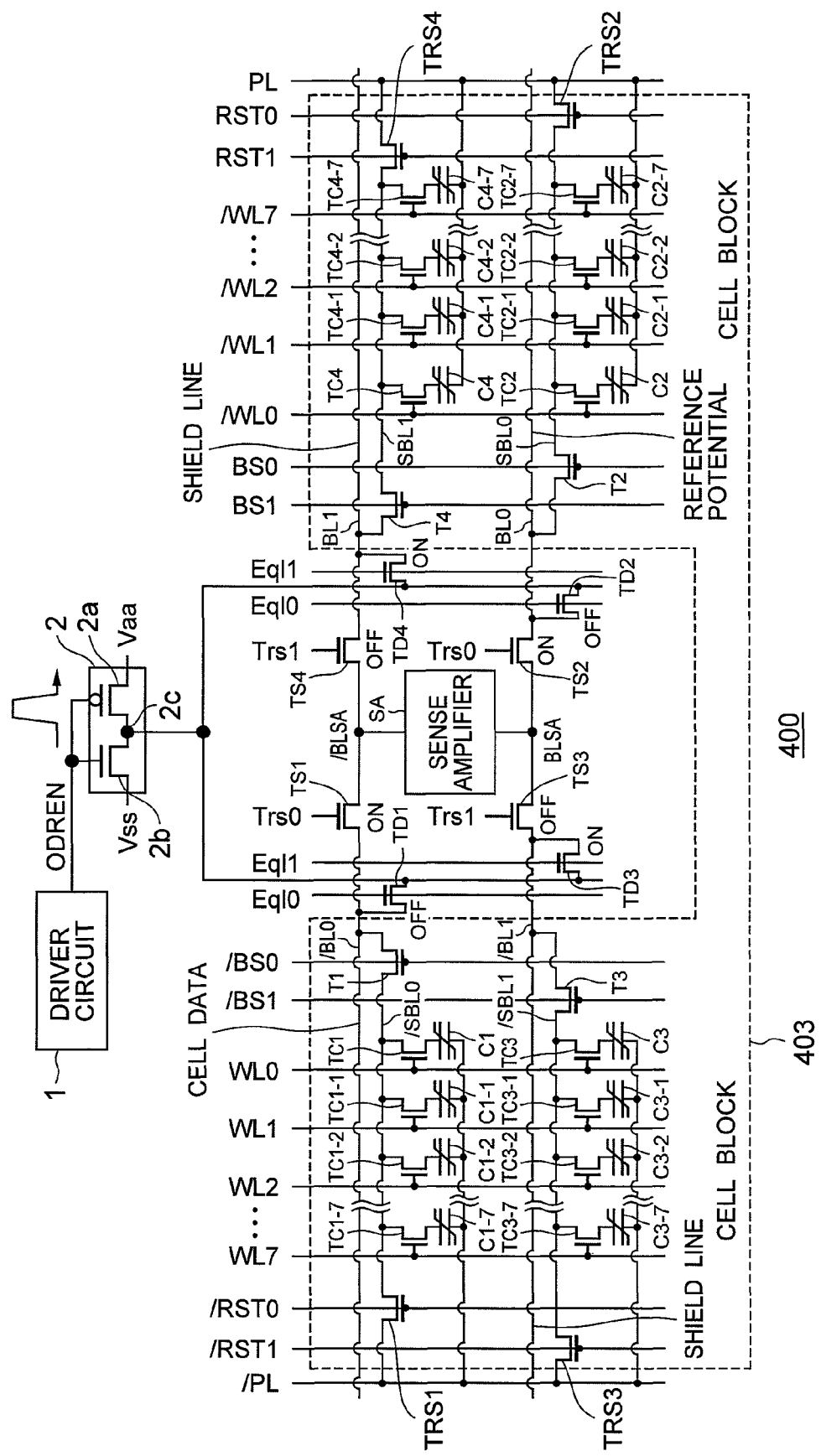
FIG. 9 is a circuit diagram showing an example of a configuration of a ferro-electric random access memory apparatus 400 according to the fourth embodiment.

FIG. 9 is a circuit diagram showing an example of a configuration of a ferro-electric random access memory apparatus 400 according to the fourth embodiment. In FIG. 9, components denoted by the same characters as those shown in FIG. 5 are components which are like those in the ferro-electric random access memory apparatus 200 in the second embodiment.

As shown in FIG. 9, the ferro-electric random access memory apparatus 400 includes a driver circuit 1, an inverter 2, a cell block 403, a sense amplifier SA, first to fourth bit lines /BL0, BL0, /BL1 and BL1, selection lines /BS0, BS0, /BS1 and BS1, word lines WL0 to WL7 and /WL0 to /WL7, selection word lines /RST0, RST0, /RST1 and RST1, local bit lines /SBL0, SBL0, /SBL1 and SBL1, first and second plate lines /PL and PL, first and second sense amplifier bit lines /BLSA and BLSA, changeover lines Eql0 and Eql1, sense changeover lines Trs0 and Trs1, first to fourth sense changeover MOS transistors TS1 to TS4, and first to fourth drive MOS transistors TD1 to TD4.

The first bit line /BL0 is disposed on the same straight line as the fourth bit line BL1 in parallel to the fourth bit line BL1.

The second bit line BL0 is disposed on the same straight line as the third bit line /BL1 in parallel to the first and third bit lines /BL0 and /BL1.

The third bit line /BL1 is disposed to be adjacent to the first bit line /BL0 in parallel to the first bit line /BL0.

The fourth bit line BL1 is disposed to be adjacent to the second bit line BL0 in parallel to the second bit line BL0.

Only one cell block 403 is shown in FIG. 9 for brevity. The ferro-electric random access memory apparatus 400 includes a plurality of cell blocks 403 arranged in, for example, a longitudinal direction of FIG. 9. In the ferro-electric random access memory apparatus 400, therefore, a plurality of bit lines associated with the plurality of cell blocks are arranged in parallel. In other words, capacitance coupling is generated between these adjacent bit lines.

The cell block 403 includes first to fourth selection MOS transistors T1 to T4, first ferro-electric capacitors C1, C1-1, C1-2, . . . C1-7, second ferro-electric capacitors C2, C2-1, C2-2, . . . C2-7, third ferro-electric capacitors C3, C3-1, C3-2, . . . C3-7, fourth ferro-electric capacitors C4, C4-1, C4-2, . . . C4-7, MOS transistors TC1, TC1-1, TC1-2, . . . TC1-7, TC2, TC2-1, TC2-2, . . . TC2-7, TC3, TC3-1, TC3-2, . . . TC3-7, TC4, TC4-1, TC4-2, . . . TC4-7, and first to fourth local MOS transistors TRS1 to TRS4.

The first selection MOS transistor T1 is connected at its first end to the first bit line /BL0. The first selection MOS transistor T1 is connected at its gate to the selection line /BS0. The first local bit line /SBL0 is connected at its first end to a second end of the first selection MOS transistor T1.

The second selection MOS transistor T2 is connected at its first end to the second bit line BL0. The second selection MOS transistor T2 is connected at its gate to the selection line BS0. The second local bit line SBL0 is connected at its first end to a second end of the second selection MOS transistor T2.

The third selection MOS transistor T3 is connected at its first end to the third bit line /BL1. The third selection MOS transistor T3 is connected at its gate to the selection line /BS1. The third local bit line /SBL1 is connected at its first end to a second end of the third selection MOS transistor T3.

The fourth selection MOS transistor T4 is connected at its first end to the fourth bit line BL1. The fourth selection MOS transistor T4 is connected at its gate to the selection line BS1. The fourth local bit line SBL1 is connected at its first end to a second end of the fourth selection MOS transistor T4.

The first to fourth selection MOS transistors T1 to T4 are controlled by these four selection lines /BS0, BS0, /BS1 and BS1, respectively.

The first local MOS transistor TRS1 is connected between a second end of the first local bit line /SBL0 and the first plate line /PL. The first local MOS transistor TRS1 is connected at its gate to the selection word line /RST0.

The second local MOS transistor TRS2 is connected between a second end of the second local bit line SBL0 and the second plate line PL. The second local MOS transistor TRS2 is connected at its gate to the selection word line RST0.

The third local MOS transistor TRS3 is connected between a second end of the third local bit line /SBL1 and the first plate line /PL. The third local MOS transistor TRS3 is connected at its gate to the selection word line /RST1.

The fourth local MOS transistor TRS4 is connected between a second end of the fourth local bit line SBL1 and the second plate line PL. The fourth local MOS transistor TRS4 is connected at its gate to the selection word line RST1.

The first ferro-electric capacitors C1, C1-1, C1-2, . . . C1-7 are connected in parallel between the first local bit line /SBL0 and the first plate line /PL.

The first ferro-electric capacitors C1, C1-1, C1-2, . . . C1-7 are connected respectively in series with the corresponding MOS transistors TC1, TC1-1, TC1-2, . . . TC1-7 between the first local bit line /SBL0 and the first plate line /PL. Gates of the MOS transistors TC1, TC1-1, TC1-2, . . . TC1-7 are connected to the word lines WL0 to WL7, respectively.

For example, a first electrode of the first ferro-electric capacitor C1 is connected to the first local bit line /SBL0 via the MOS transistor TC1. In addition, a second electrode of the first ferro-electric capacitor C1 is connected to the first plate line /PL.

The second ferro-electric capacitors C2, C2-1, C2-2, . . . C2-7 are connected in parallel between the second local bit line SBL0 and the second plate line PL.

The second ferro-electric capacitors C2, C2-1, C2-2, . . . C2-7 are connected respectively in series with the corresponding MOS transistors TC2, TC2-1, TC2-2, . . . TC2-7 between the second local bit line SBL0 and the second plate line PL. Gates of the MOS transistors TC2, TC2-1, TC2-2, . . . TC2-7 are connected to the word lines /WL0 to /WL7, respectively.

For example, a first electrode of the second ferro-electric capacitor C2 is connected to the second local bit line SBL0 via the MOS transistor TC2. In addition, a second electrode of the second ferro-electric capacitor C2 is connected to the second plate line PL.

The third ferro-electric capacitors C3, C3-1, C3-2, . . . C3-7 are connected in parallel between the third local bit line /SBL1 and the first plate line /PL.

The third ferro-electric capacitors C3, C3-1, C3-2, . . . C3-7 are connected respectively in series with the corresponding MOS transistors TC3, TC3-1, TC3-2, . . . TC3-7 between the third local bit line /SBL1 and the first plate line /PL. Gates of the MOS transistors TC3, TC3-1, TC3-2, . . . TC3-7 are connected to the word lines WL0 to WL7, respectively.

For example, a first electrode of the third ferro-electric capacitor C3 is connected to the third local bit line /SBL1 via the MOS transistor TC3. In addition, a second electrode of the third ferro-electric capacitor C3 is connected to the first plate line /PL.

The fourth ferro-electric capacitors C4, C4-1, C4-2, . . . C4-7 are connected in parallel between the fourth local bit line SBL1 and the second plate line PL.

The fourth ferro-electric capacitors C4, C4-1, C4-2, . . . C4-7 are connected respectively in series with the corresponding MOS transistors TC4, TC4-1, TC4-2, . . . TC4-7 between the fourth local bit line SBL1 and the second plate line PL. Gates of the MOS transistors TC4, TC4-1, TC4-2, . . . TC4-7 are connected to the word lines /WL0 to /WL7, respectively.

For example, a first electrode of the fourth ferro-electric capacitor C4 is connected to the fourth local bit line SBL1 via the MOS transistor TC4. In addition, a second electrode of the fourth ferro-electric capacitor C4 is connected to the second plate line PL.

The first to fourth ferro-electric capacitors C1, C1-1, C1-2, . . . C1-7, C2, C2-1, C2-2, . . . C2-7, C3, C3-1, C3-2, . . . C3-7, C4, C4-1, C4-2, . . . C4-7 are adapted to store data according to a voltage applied between two electrodes and a polarization state depending on the polarity of the voltage.

For example, the potential on the selection line BS0 is set to the "high" level, the potential on the word line WL0 is set to the "high" level, and the potential on the word lines WL1 to WL7 is set to the "low" level. As a result, the first selection MOS transistor T1 and the MOS transistor TC1 turn on, and the MOS transistors TC1-1, TC1-2, . . . TC1-7 turn off. As a result, electrical conduction between the first bit line /BL0 and the first electrode of the first ferro-electric capacitor C1 is obtained, and electrical conduction between the first plate line /PL0 and the second electrode of the first ferro-electric capacitor C1 is obtained. By controlling the potential on the first plate line /PL0 in this state, a potential depending on data stored on the first ferro-electric capacitor C1 is applied to the first bit line /BL0.

Other configurations of the ferro-electric random access memory apparatus 400 are the same as those of the ferro-electric random access memory apparatus 200 according to the second embodiment.

A readout operation conducted by applying the scheme according to the present invention to the ferro-electric random access memory apparatus 400 having the configuration described heretofore will now be described.

Hereafter, the readout operation will be described by taking the 1T1C operation in which 1-bit data is retained on one ferro-electric capacitor (cell) as an example in the same way as the second embodiment. Especially, as an example, the case where data on the first ferro-electric capacitor C1 is read will be described.

Figure 10:
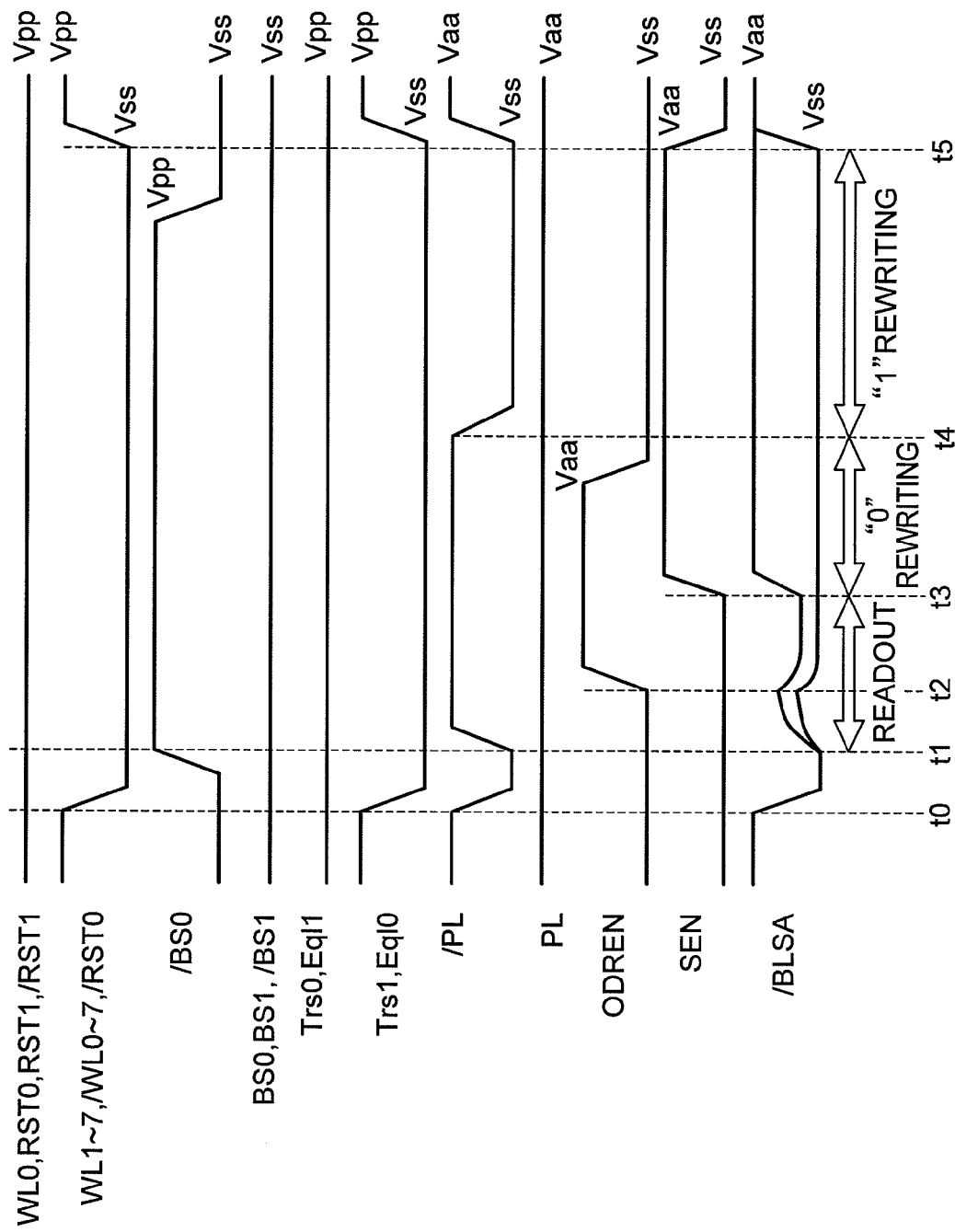
FIG. 10 is a diagram showing a timing chart of potentials on respective signal lines and potential waveforms of respective signals in a cycle of data readout operation from the first ferro-electric capacitor C1 in the ferro-electric random access memory apparatus 400 shown in FIG. 9.

FIG. 10 is a diagram showing a timing chart of potentials on respective signal lines and potential waveforms of respective signals in a cycle of data readout operation from the first ferro-electric capacitor C1 in the ferro-electric random access memory apparatus 400 shown in FIG. 9.

In a standby state (a state after writing is completed) before time t0, the level of the bit line potential control signal ODREN is controlled to assume the ground potential (second potential) Vss, and the word lines WL0 to WL7, /WL0 to /WL7, the selection word lines /RST0, RST0, /RST1 and RST1, the changeover lines Eql0 and Eql1, and the sense changeover lines Trs0 and Trs1 are precharged to the potential Vpp, as shown in FIG. 10.

As a result, the MOS transistors TC1, TC1-1, TC1-2, . . . TC1-7, TC2, TC2-1, TC2-2, . . . TC2-7, TC3, TC3-1, TC3-2, . . . TC3-7, TC4, TC4-1, TC4-2, . . . TC4-7, the first to fourth drive MOS transistors TD1 to TD4, the first to fourth local MOS transistors TRS1 to TRS4, and the first to fourth sense changeover MOS transistors TS1 to TS4 are in the on-state.

Furthermore, the selection lines /BS0, BS0, /BS1 and BS1 are controlled to assume the ground potential Vss. As a result, the first to fourth selection MOS transistors T1 to T4 are in the off-state in the standby state.

In addition, all of the first to fourth bit lines /BL0, BL0, /BL1 and BL1, the first and second sense amplifier bit lines /BLSA and BLSA, and the first and second plate lines /PL and PL are precharged to the power supply potential (first potential) Vaa.

When reading the first ferro-electric capacitor C1, the potential on the changeover line Eql0 is controlled to assume the ground potential Vss at time t0. As a result, the first and second bit lines /BL0 and BL0 are insulated from the output terminal 2c of the inverter 2.

At this time, the sense changeover line Trs1 is discharged to the ground potential Vss, and the third and fourth sense changeover MOS transistors TS3 and TS4 turn off. As a result, the third and fourth bit lines /BL1 and BL1 are insulated from the first and second sense amplifier bit lines /BLSA and BLSA, and the first and second bit lines /BL0 and BL0, respectively.

In addition, the potential on the first plate line /PL0 is controlled to change from the power supply potential Vaa to the ground potential Vss. In addition, the first and second sense amplifier bit lines /BLSA and BLSA are discharged to the ground potential Vss by the sense amplifier SA.

In addition, the word lines WL1 to WL7, /WL1 to /WL7, and the selection word line /RST0 are discharged to the ground potential Vss. As a result, the MOS transistors TC1-1, TC1-2, . . . TC1-7, TC2, TC2-1, TC2-2, . . . TC2-7, TC3-1, TC3-2, . . . TC3-7, TC4, TC4-1, TC4-2, . . . TC4-7, and the first local MOS transistor TRS1 turn off. Consequently, the first plate line /PL is insulated from the first local bit line /SBL0. At this time point, a column of the first ferro-electric capacitor C1 is selected.

Then, at time t1, the selection line /BS0 is charged to the potential Vpp and consequently only the first selection MOS transistor T1 turns on. In addition, the first plate line /PL is controlled to assume the power supply potential Vaa. As a result, data stored on the first ferro-electric capacitor C1 is read onto the first bit line /BL0. At this time, the first and second sense changeover MOS transistors TS1 and TS2 remain on, and consequently there is conduction between the first bit line /BL0 and the first sense amplifier bit line /BLSA. In other words, the potential on the first sense amplifier bit line /BLSA changes according to the data stored on the first ferro-electric capacitor C1 (after the time t1).

Then, at time t2, the level of the bit line potential control signal ODREN is controlled to assume the power supply potential Vaa by the driver circuit 1 (in other words, the potential on the output terminal 2c of the inverter 2 is controlled to assume the ground potential Vss). As a result, the potential on the third and fourth bit lines /BL1 and BL1 which serve as the shield lines is changed to the ground potential Vss.

In this way, the potential on the third and fourth bit lines /BL1 and BL1 which serve as the shield lines is changed to the ground potential Vss according to the bit line potential control signal ODREN.

As a result, the potential on the first bit line /BL0 is lowered (kicked downward) by capacitance coupling between adjacent bit lines.

Therefore, the potential difference between the first plate line /PL and the first bit line /BL0 becomes greater. In other words, the voltage applied between electrodes of the first ferro-electric capacitor C1 increases. As a result, the signal quantity Vsigwin of the ferro-electric random access memory apparatus 400 already described increases.

Then, at time t3, the potential of the sense amplifier drive signal SEN is controlled to assume the power supply potential Vaa and consequently the sense amplifier SA is started (activated). The potential on the first sense amplifier bit line /BLSA (the first bit line /BL0) sensed by the sense amplifier SA is amplified to the ground potential Vss when the data stored on the first ferro-electric capacitor C1 is "0," whereas it is amplified to the power supply potential Vaa when the data stored on the first ferro-electric capacitor C1 is "1."

Over a time period between the time t3 and time t4 when the potential on the first plate line /PL is controlled to assume the ground potential Vss, the sense amplifier SA is in the driven state. If the data stored on the first ferro-electric capacitor C1 is "0," then the time period is a time period for rewriting "0" onto the first ferro-electric capacitor C1.

During the "0" rewriting time period, the level of the bit line potential control signal ODREN is controlled to assume the ground potential Vss. Then at the time t4, the first plate line /PL is discharged to the ground potential Vss and thereby the "0" rewriting time period is finished.

At the time t4, the sense amplifier SA is in the driven state and the potential on the first plate line /PL is dropped to the ground potential Vss. If the data stored on the first ferro-electric capacitor C1 is "1," then rewriting "1" onto the first ferro-electric capacitor C1 is started (from time t4 on). The "1" rewriting lasts until the potential of the sense amplifier drive signal SEN becomes the ground potential Vss and the sense amplifier SA is inactivated (until time t5).

As a result of the operation described heretofore, the cycle of the readout operation of data from the first ferro-electric capacitor C1 in the ferro-electric random access memory apparatus 400 is finished.

In the present fourth embodiment, the scheme in which the capacitor for coupling is not added is proposed in the same way as the second embodiment as already described. As a result, the bit line capacitance does not increase. Therefore, the ferro-electric capacitor can be controlled without decreasing the signal quantity and a greater signal quantity can be obtained as compared with the comparative example already described (FIG. 2). In addition, since the capacitor for coupling is not added, the increase of the area of the circuit can be suppressed as compared with the comparative example already described.

According to the ferro-electric random access memory apparatus in the present embodiment, the gain of the cell signal quantity can be increased while suppressing the increase of the circuit area as described heretofore.

Fifth Embodiment

In the fourth embodiment, the configuration in which a plurality of ferro-electric capacitors are connected in parallel (in a ladder form) has been described.

In the present fifth embodiment, another configuration in which a plurality of ferro-electric capacitors are connected in parallel (in a ladder form) will be described.

Figure 11:
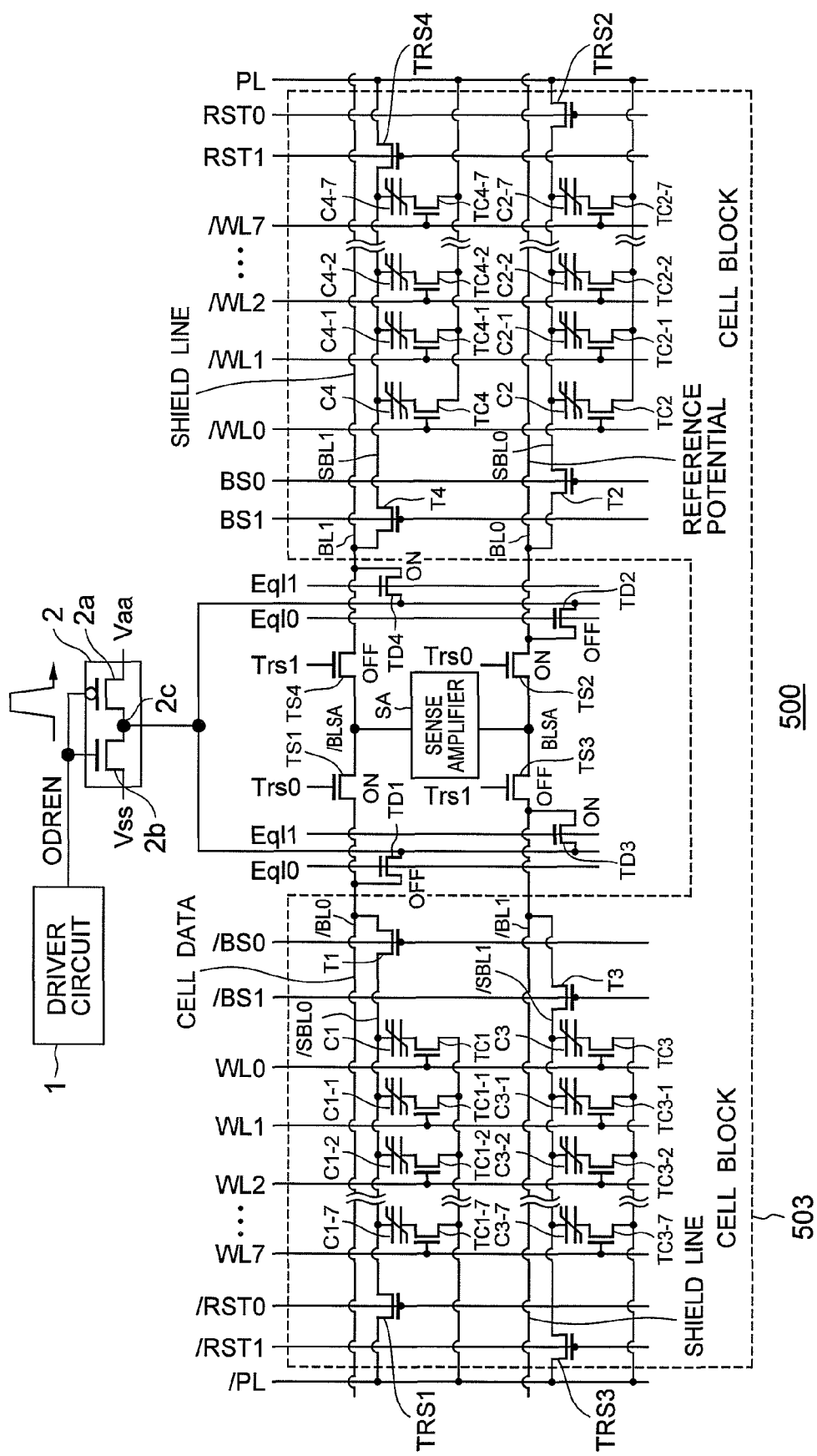
FIG. 11 is a circuit diagram showing an example of a configuration of a ferro-electric random access memory apparatus 500 according to the fifth embodiment.

FIG. 11 is a circuit diagram showing an example of a configuration of a ferro-electric random access memory apparatus 500 according to the fifth embodiment. In FIG. 11, components denoted by the same characters as those shown in FIG. 9 are components which are like those in the ferro-electric random access memory apparatus 400 in the fourth embodiment.

As shown in FIG. 11, the ferro-electric random access memory apparatus 500 differs only in a configuration of a cell block 500 from the ferro-electric random access memory apparatus 400 according to the fourth embodiment. In other words, connection relations between the ferro-electric capacitors and the MOS transistors are different from those in the fourth embodiment.

The cell block 503 includes first to fourth selection MOS transistors T1 to T4, first ferro-electric capacitors C1, C1-1, C1-2, ... C1-7, second ferro-electric capacitors C2, C2-1, C2-2, ... C2-7, third ferro-electric capacitors C3, C3-1, C3-2, ... C3-7, fourth ferro-electric capacitors C4, C4-1, C4-2, ... C4-7, MOS transistors TC1, TC1-1, TC1-2, ... TC1-7, TC2, TC2-1, TC2-2, ... TC2-7, TC3, TC3-1, TC3-2, ... TC3-7, TC4, TC4-1, TC4-2, ... TC4-7, and first to fourth local MOS transistors TRS1 to TRS4.

The first ferro-electric capacitors C1, C1-1, C1-2, ... C1-7 are connected respectively in series with the corresponding MOS transistors TC1, TC1-1, TC1-2, ... TC1-7 between the first local bit line /SBL0 and the first plate line /PL. In particular, the first ferro-electric capacitors C1, C1-1, C1-2, ... C1-7 are connected on the first local bit line /SBL0 side, whereas the MOS transistors TC1, TC1-1, TC1-2, ... TC1-7 are connected on the first plate line /PL side.

The second ferro-electric capacitors C2, C2-1, C2-2, ... C2-7 are connected respectively in series with the corresponding MOS transistors TC2, TC2-1, TC2-2, ... TC2-7 between the second local bit line SBL0 and the second plate line PL. In particular, the second ferro-electric capacitors C2, C2-1, C2-2, ... C2-7 are connected on the second local bit line SBL0 side, whereas the MOS transistors TC2, TC2-1, TC2-2, ... TC2-7 are connected on the second plate line PL side.

The third ferro-electric capacitors C3, C3-1, C3-2, ... C3-7 are connected respectively in series with the corresponding MOS transistors TC3, TC3-1, TC3-2, ... TC3-7 between the third local bit line /SBL1 and the first plate line /PL. In particular, the third ferro-electric capacitors C3, C3-1, C3-2, ... C3-7 are connected on the third local bit line /SBL1 side, whereas the MOS transistors TC3, TC3-1, TC3-2, ... TC3-7 are connected on the first plate line /PL side.

The fourth ferro-electric capacitors C4, C4-1, C4-2, ... C4-7 are connected respectively in series with the corresponding MOS transistors TC4, TC4-1, TC4-2, ... TC4-7 between the fourth local bit line SBL1 and the second plate line PL. In particular, the fourth ferro-electric capacitors C4, C4-1, C4-2, ... C4-7 are connected on the fourth local bit line SBL1 side, whereas the MOS transistors TC4, TC4-1, TC4-2, ... TC4-7 are connected on the second plate line PL side.

Other configurations of the ferro-electric random access memory apparatus 500 are the same as those of the ferro-electric random access memory apparatus 400 according to the fourth embodiment.

A readout operation conducted by applying the scheme according to the present invention to the ferro-electric random access memory apparatus 400 having the configuration described heretofore is similar to that in the fourth embodiment.

In the present fifth embodiment, the scheme in which the capacitor for coupling is not added is proposed in the same way as the fourth embodiment as already described. As a result, the bit line capacitance does not increase. Therefore, the ferro-electric capacitor can be controlled without decreasing the signal quantity and a greater signal quantity can be obtained as compared with the comparative example already described (FIG. 2). In addition, since the capacitor for coupling is not added, the increase of the area of the circuit can be suppressed as compared with the comparative example already described.

According to the ferro-electric random access memory apparatus in the present embodiment, the gain of the cell signal quantity can be increased while suppressing the increase of the circuit area as described heretofore.

Sixth Embodiment

In the first to fifth embodiments already described, the sense amplifier, the cell block and four or two bit lines attached to them constitute a minimum unit of columns. In the memory cell array in the actual ferro-electric random access memory apparatus, the minimum unit is repeated in the vertical direction of the drawing of each embodiment.

For example, it is now assumed that data is read onto the first bit line /BL0 in the ferro-electric random access memory apparatus 100 in the first embodiment shown in FIG. 3. In this case, the third bit line /BL1 and a bit line equivalent to the fourth bit line BL1, i.e., a total of two bit lines serve as shield bit lines adjacent to /BL0. The first bit line /BL0 is driven by the two bit lines.

If the first bit line /BL0 is disposed at an end of the memory cell array, a bit line which serves as a shield line adjacent to the first bit line /BL0 is only the third bit line /BL1, i.e., only one bit line.

In the present sixth embodiment, therefore, a configuration in which a dummy bit line is provided at an end of the memory cell array in order to make readout operations for all cells on the memory cell array equivalent will be described. In the sixth embodiment, the case where the configuration is applied to the configuration in the first embodiment will be described as an example.

Figure 12:
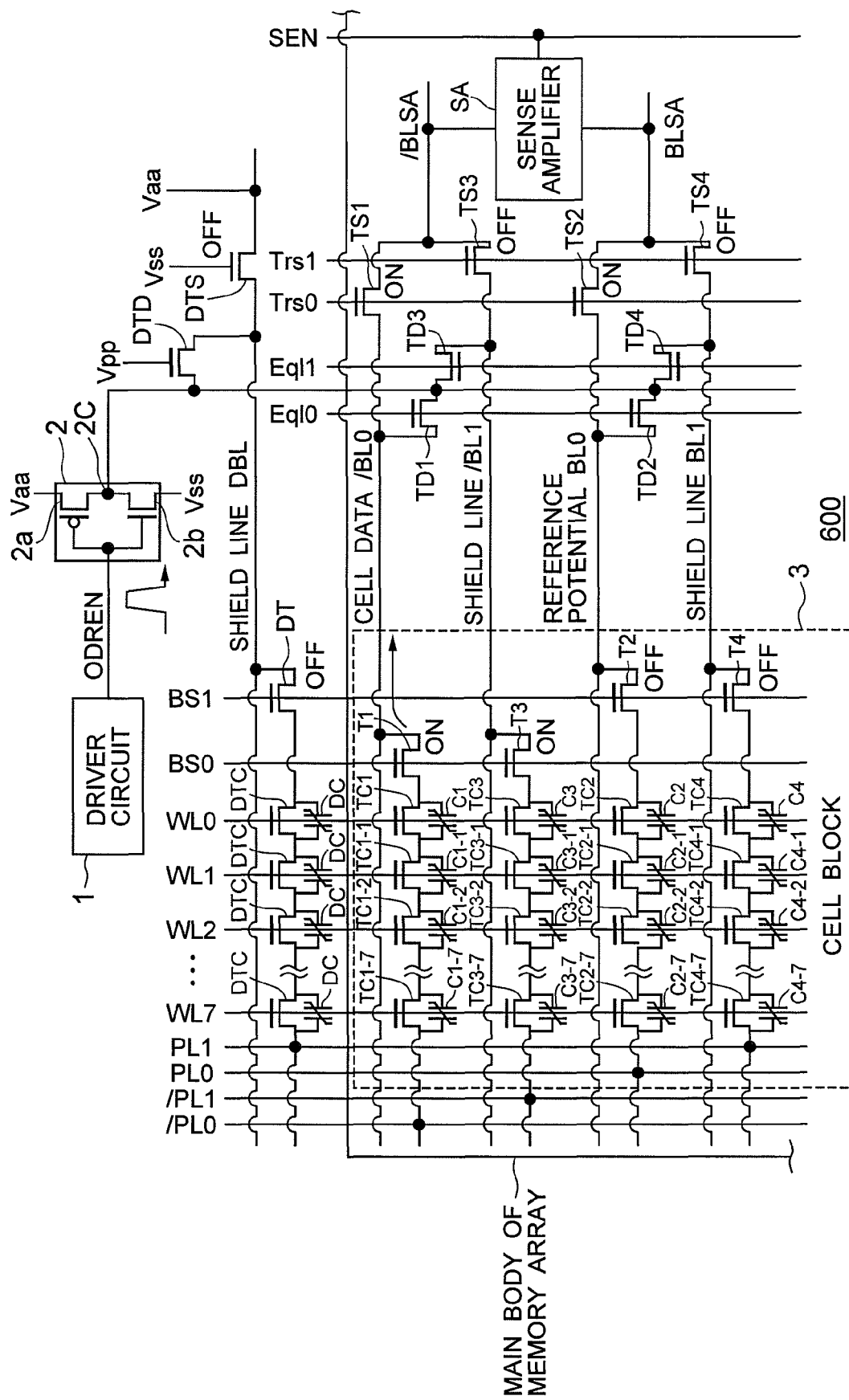
FIG. 12 is a circuit diagram showing an example of a configuration of a ferro-electric random access memory apparatus 600 according to the sixth embodiment.

FIG. 12 is a circuit diagram showing an example of a configuration of a ferro-electric random access memory apparatus 600 according to the sixth embodiment. In FIG. 12, components denoted by the same characters as those shown in FIG. 3 are components which are like those in the ferro-electric random access memory apparatus 100 in the first embodiment.

As shown in FIG. 12, the ferro-electric random access memory apparatus 600 further includes a dummy bit line DBL, a dummy drive MOS transistor DTD, a dummy sense changeover MOS transistor DTS, a dummy selection MOS transistor DT, dummy ferro-electric capacitors DC, and dummy MOS transistors DTC, as compared with the ferro-electric random access memory apparatus 100. Here, the dummy drive MOS transistor DTD is further included in the bit line potential control circuit already described.

The dummy bit line DBL is disposed to be adjacent to and parallel to the first bit line /BL0 so as to have the first bit line /BL0 disposed between the third bit line /BL1 and the dummy bit line DBL.

The dummy drive MOS transistor DTD is connected between the output terminal 2c of the inverter 2 and the dummy bit line DBL. The dummy drive MOS transistor DTD is supplied at its gate with the potential Vpp, and is in the on-state.

The dummy sense changeover MOS transistor DTS is connected between the power supply potential Vaa and the dummy bit line DBL. The dummy sense changeover MOS transistor DTS is supplied at its gate with the ground potential Vss, and is in the off-state.

The dummy ferro-electric capacitors DC connected in series and the dummy selection MOS transistors are connected in series between the dummy bit line DBL and the fourth plate line PL1.

The dummy MOS transistors DTC are connected in parallel to the dummy ferro-electric capacitors DC, respectively. Word lines WL1 to WL7 are connected to gates of the dummy MOS transistors DTC, respectively.

As a result, bit lines for driving the first bit line /BL0 disposed at an end of the memory cell array become two bit lines, i.e., the third bit line /BL1 and the dummy bit line DBL.

Incidentally, the dummy changeover MOS transistor DTS has the same size as that of the first to fourth sense changeover MOS transistors TS1 to TS4. As a result, the capacitance of the dummy bit line can be made equal to that of each bit line in the cell block 3.

Readout operation of the ferro-electric random access memory apparatus 600 having the configuration described heretofore is similar to that in the first embodiment.

In other words, when the potential on the third and fourth bit lines /BL1 and BL1 is changed from the power supply potential Vaa to the ground potential Vss in readout of data from the first ferro-electric capacitor C1, the potential on the dummy bit line DBL is changed from the power supply potential Vaa to the ground potential Vss.

As a result, it becomes possible to read data onto the first bit line /BL0 disposed at an end of the memory cell array under a condition equivalent to that of other bit lines on the memory cell array, by using utterly the same operation waveform as that in the first embodiment.

Incidentally, the dummy bit line may also be provided at an end of the memory cell array in the ferro-electric random access memory apparatuses 200 to 500 according to the second to fifth embodiments already described.

As a result, it is possible to conduct readout operation equivalently on all cells in the memory cell array with the same operation in the ferro-electric random access memory apparatuses according to the second to fifth embodiments as well.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A ferro-electric random access memory apparatus comprising:
  a memory cell array comprising a plurality of memory cells, each memory cell comprising a transistor and a ferro-electric capacitor, wherein the memory cell array comprises
    word lines configured to select a memory cell,
    plate lines configured to apply a voltage to a first end of the ferro-electric capacitor in the memory cell, and
    bit lines configured to read cell data from a second end of the ferro-electric capacitor in the memory cell;

a sense amplifier configured to sense and amplify a signal read from the ferro-electric capacitor onto a selected bit line; and a bit line potential control circuit configured to pull down a voltage on an adjacent bit line before operation of the sense amplifier at a time of data readout, wherein the adjacent bit line is adjacent to the selected bit line, wherein the ferro-electric capacitor and the transistor are connected in parallel.

2. The ferro-electric random access memory apparatus according to claim 1, wherein the bit line potential control circuit is configured to pull down a potential on the adjacent bit line from a precharged potential to a ground potential at the time of data readout in order to pull down a potential on the selected bit line by means of bit line capacitance coupling between the selected bit line and the adjacent bit line.

3. A ferro-electric random access memory apparatus comprising:
a memory cell array comprising a plurality of memory cells, each memory cell comprising a transistor and a ferro-electric capacitor, wherein the memory cell array comprises
word lines configured to select a memory cell,
plate lines configured to apply a voltage to a first end of the ferro-electric capacitor in the memory cell, and
bit lines configured to read cell data from a second end of the ferro-electric capacitor in the memory cell;
a sense amplifier configured to sense and amplify a signal read from the ferro-electric capacitor onto a selected bit line;
a bit line potential control circuit configured to pull down a voltage on an adjacent bit line before operation of the sense amplifier at a time of data readout, wherein the adjacent bit line is adjacent to the selected bit line; and
a dummy bit line disposed at an end of the memory cell array,
wherein the bit line potential control circuit is configured to pull down a potential on the adjacent bit line from a precharged potential to a ground potential at the time of data readout in order to pull down a potential on the selected bit line by means of bit line capacitance coupling between the selected bit line and the adjacent bit line,
wherein the bit line potential control circuit is configured to pull down a potential on the dummy bit line from a precharged potential to a ground potential at the time of data readout in order to pull down a potential on the selected bit line by means of bit line capacitance coupling between the selected bit line and the dummy bit line adjacent to the selected bit line.

4. The ferro-electric random access memory apparatus according to claim 3, wherein the bit line potential control circuit comprises a driver circuit configured to output a bit line potential control signal, and configured to pull down the potential on the adjacent bit line according to the bit line potential control signal.

5. The ferro-electric random access memory apparatus according to claim 4, wherein
the bit line potential control circuit comprises an inverter configured to invert the bit line potential control signal and to output a resultant signal.

6. A ferro-electric random access memory apparatus comprising:
a memory cell array comprising a plurality of memory cells, each memory cell comprising a transistor and a ferro-electric capacitor, wherein the memory cell array comprises
word lines configured to select a memory cell,
plate lines configured to apply a voltage to a first end of the ferro-electric capacitor in the memory cell, and
bit lines configured to read cell data from a second end of the ferro-electric capacitor in the memory cell;
a sense amplifier configured to sense and amplify a signal read from the ferro-electric capacitor onto a selected bit line; and
a bit line potential control circuit configured to pull down a voltage on an adjacent bit line before operation of the sense amplifier at a time of data readout, wherein the adjacent bit line is adjacent to the selected bit line,
wherein the bit line potential control circuit is configured to pull down a potential on the adjacent bit line from a precharged potential to a ground potential at the time of data readout in order to pull down a potential on the selected bit line by means of bit line capacitance coupling between the selected bit line and the adjacent bit line, and
wherein the bit line potential control circuit comprises a driver circuit configured to output a bit line potential control signal, and configured to pull down the potential on the adjacent bit line according to the bit line potential control signal.

7. The ferro-electric random access memory apparatus according to claim 6, wherein
the bit line potential control circuit comprises an inverter configured to invert the bit line potential control signal and to output a resultant signal.

8. The ferro-electric random access memory apparatus according to claim 7, wherein the ferro-electric capacitor and the transistor are connected in series.

9. The ferro-electric random access memory apparatus according to claim 7, wherein the ferro-electric capacitor and the transistor are connected in parallel.

* * * * *